United States Patent
Wang et al.

(10) Patent No.: US 9,064,986 B2
(45) Date of Patent: Jun. 23, 2015

(54) PHOTO DIODE AND METHOD OF FORMING THE SAME

(71) Applicant: Taiwan Semiconductor Manufacturing Company Limited, Hsinchu (TW)

(72) Inventors: Tzu-Jui Wang, Kaohsiung (TW);
Keng-Yu Chou, Kaohsiung (TW);
Chun-Hao Chuang, Hsinchu (TW);
Ming-Chieh Hsu, Hsinchu (TW);
Yuichiro Yamashita, Hsinchu (TW);
Jen-Cheng Liu, Hsinchu (TW);
Dun-Nian Yaung, Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 56 days.

(21) Appl. No.: 14/025,890

(22) Filed: Sep. 13, 2013

(65) Prior Publication Data

US 2015/0076637 A1  Mar. 19, 2015

(51) Int. Cl.
*H01L 21/00* (2006.01)
*H01L 31/113* (2006.01)
*H01L 31/0232* (2014.01)
*H01L 31/18* (2006.01)

(52) U.S. Cl.
CPC ............ *H01L 31/0232* (2013.01); *H01L 31/18* (2013.01)

(58) Field of Classification Search
CPC .................... H01L 31/02168; H01L 27/14627
USPC .................. 257/257, 294, 432–438, E31.058, 257/E31.115; 438/57, 72
See application file for complete search history.

(56) References Cited

U.S. PATENT DOCUMENTS

| | | | |
|---|---|---|---|
| 8,711,258 B2 * | 4/2014 | Takase et al. ................ | 348/294 |
| 8,716,054 B2 * | 5/2014 | Jeong .............................. | 438/69 |
| 2011/0284980 A1 * | 11/2011 | Sakoh et al. ................... | 257/432 |
| 2013/0242149 A1 * | 9/2013 | Terai et al. .................... | 348/280 |
| 2014/0035082 A1 * | 2/2014 | Chu et al. ...................... | 257/432 |
| 2014/0035083 A1 * | 2/2014 | Wan et al. ..................... | 257/432 |

* cited by examiner

*Primary Examiner* — Calvin Lee
(74) *Attorney, Agent, or Firm* — Jones Day

(57) ABSTRACT

A method for forming a photo diode is provided. The method includes: forming a first bottom electrode corresponding to a first pixel and a second bottom electrode corresponding to a second pixel over a substrate; forming a dielectric layer over the substrate; patterning the dielectric layer over the substrate; forming a photo conversion layer over the substrate; and forming a top electrode over the photo conversion layer; forming a color filter layer over the top electrode, wherein at least a portion of the dielectric layer separates a first portion of the color filter layer corresponding to a first pixel from a second portion of the color filer layer corresponding to a second pixel, and a refractive index of the dielectric layer is lower than a refractive index of the color filter layer.

20 Claims, 26 Drawing Sheets

1300

PHOTO DIODE AND METHOD OF FORMING THE SAME

FIELD

The technology described in this patent document generally relates to semiconductor processes, and, more particularly, to a photo diode and a method of forming a photo diode.

BACKGROUND

As photo-electronic technology improves, products using image technology, such as the digital cameras, scanners, and video cameras, have become more popular. In the manufacturing process of image sensors, photo diodes are capable of sensing different colors such as red, green, and blue by means of color filters. Typically, each of the photo diodes senses a specific color only. However, conventional photo diode architecture may suffer serious cross-talk issues because light received from a tilt angle may interfere with adjacent pixels.

SUMMARY

In accordance with the teachings described herein, methods and systems for forming photo diodes are provided. An exemplary first method includes: forming a first bottom electrode corresponding to a first pixel and a second bottom electrode corresponding to a second pixel over a substrate; forming a dielectric layer over the substrate; patterning the dielectric layer over the substrate; forming a photo conversion layer over the substrate; forming a top electrode over the photo conversion layer; and forming a color filter layer over the top electrode, wherein at least a portion of the dielectric layer separates a first portion of the color filter layer corresponding to a first pixel from a second portion of the color filer layer corresponding to a second pixel, and a refractive index of the dielectric layer is lower than a refractive index of the color filter layer.

A first exemplary diode includes: a substrate; a first bottom electrode corresponding to a first pixel over the substrate; a second bottom electrode corresponding to a second pixel over the substrate; a photo conversion layer over the first bottom electrode and the second bottom electrode; a top electrode over the photo conversion layer; a color filter layer over the top electrode; and a dielectric layer for separating a first portion of the color filter layer corresponding to the first pixel from a second portion of the color filter layer corresponding to the second pixel, wherein a refractive index of the dielectric layer is lower than a refractive index of the color filter layer. A second exemplary photo diode includes: a substrate; a first bottom electrode corresponding to a first pixel over the substrate; a second bottom electrode corresponding to a second pixel over the substrate; a photo conversion layer over the first bottom electrode and the second bottom electrode; a top electrode over the photo conversion layer; a color filter layer over the top electrode; and a dielectric layer for separating a first portion of the photo conversion layer corresponding to the first pixel from a second portion of the photo conversion layer corresponding to the second pixel, wherein a refractive index of the dielectric layer is lower than a refractive index of the photo conversion.

DETAILED DESCRIPTION

Reference will now be made in detail to exemplary embodiments, which are illustrated in the accompanying drawings. Wherever possible, the same reference numbers will be used throughout the drawings to refer to the same or like parts.

Figure 1:
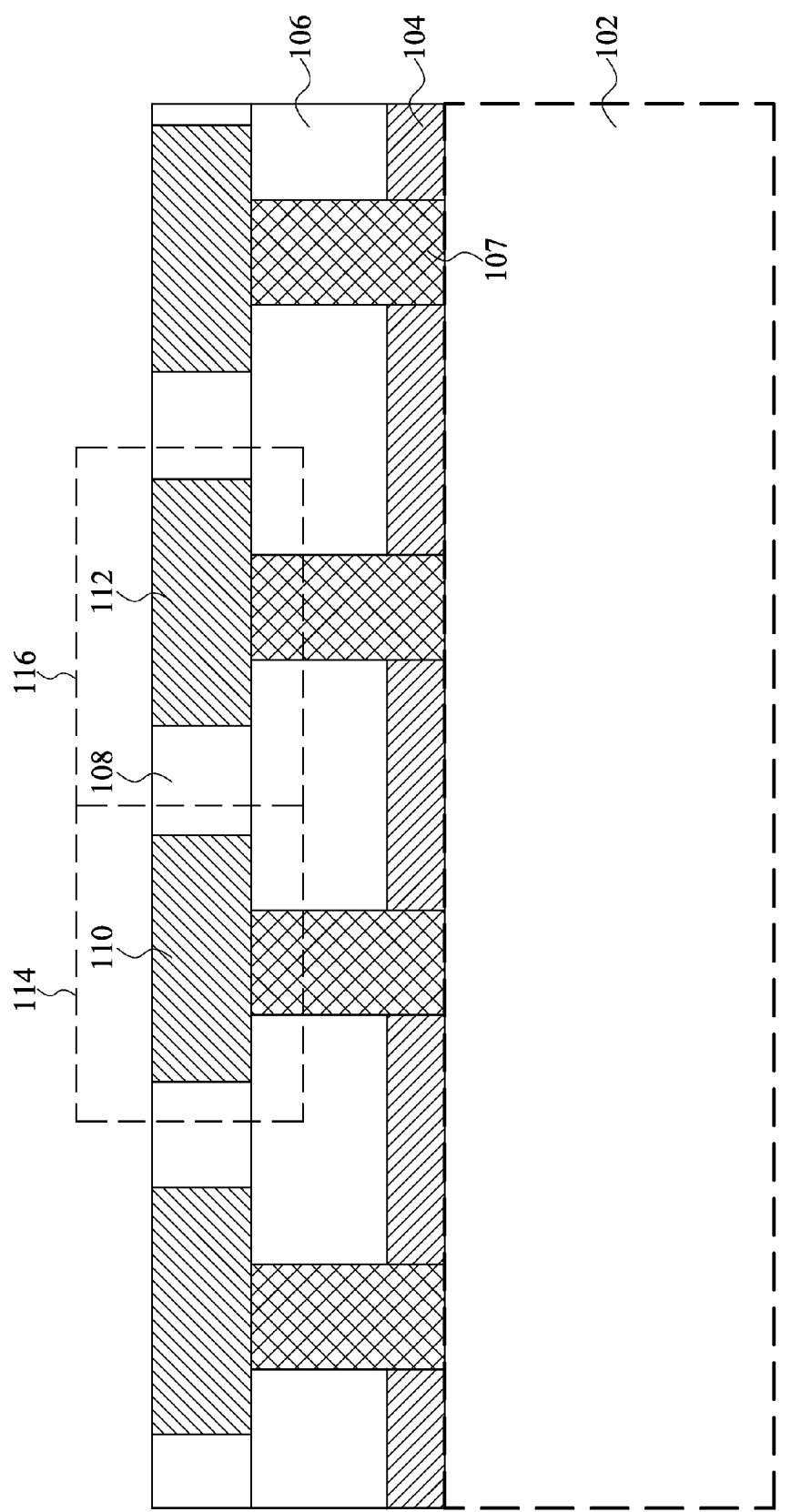
FIGS. 1-7 are exemplary diagrams during a sequence of processing stages for forming a photo diode according to a first embodiment of the invention.

FIGS. 1-7 are exemplary diagrams during a sequence of processing stages for forming a photo diode according to a first embodiment of the invention. As shown in FIG. 1, a read circuit 102 over a substrate (not shown) may be provided in a photo diode 100. A capping layer 104 for protecting vias 107 in the back end of line process may be provided over the read circuit 102. The capping layer 104 may be, for example, silicon nitride or silicon carbide. The vias 107 may be, for example, aluminum-copper or copper. A first dielectric layer 106 for electric isolation between bottom electrodes 110, 112 and other metal layers (not shown) in the back end of line process may be provided over the capping layer 104. A second dielectric layer 108 for electric isolation between bottom electrodes 110, 112 may be provided over the first dielectric layer 106. The dielectric layers 106, 108 may be, for example, oxide or other isolation materials. The bottom electrodes 110, 112 may be any metal or alloy, such as, aluminum-copper and copper. The first bottom electrode 110 may correspond to a first pixel 114 and the second bottom electrode 112 may correspond to a second pixel 116.

Figure 2:
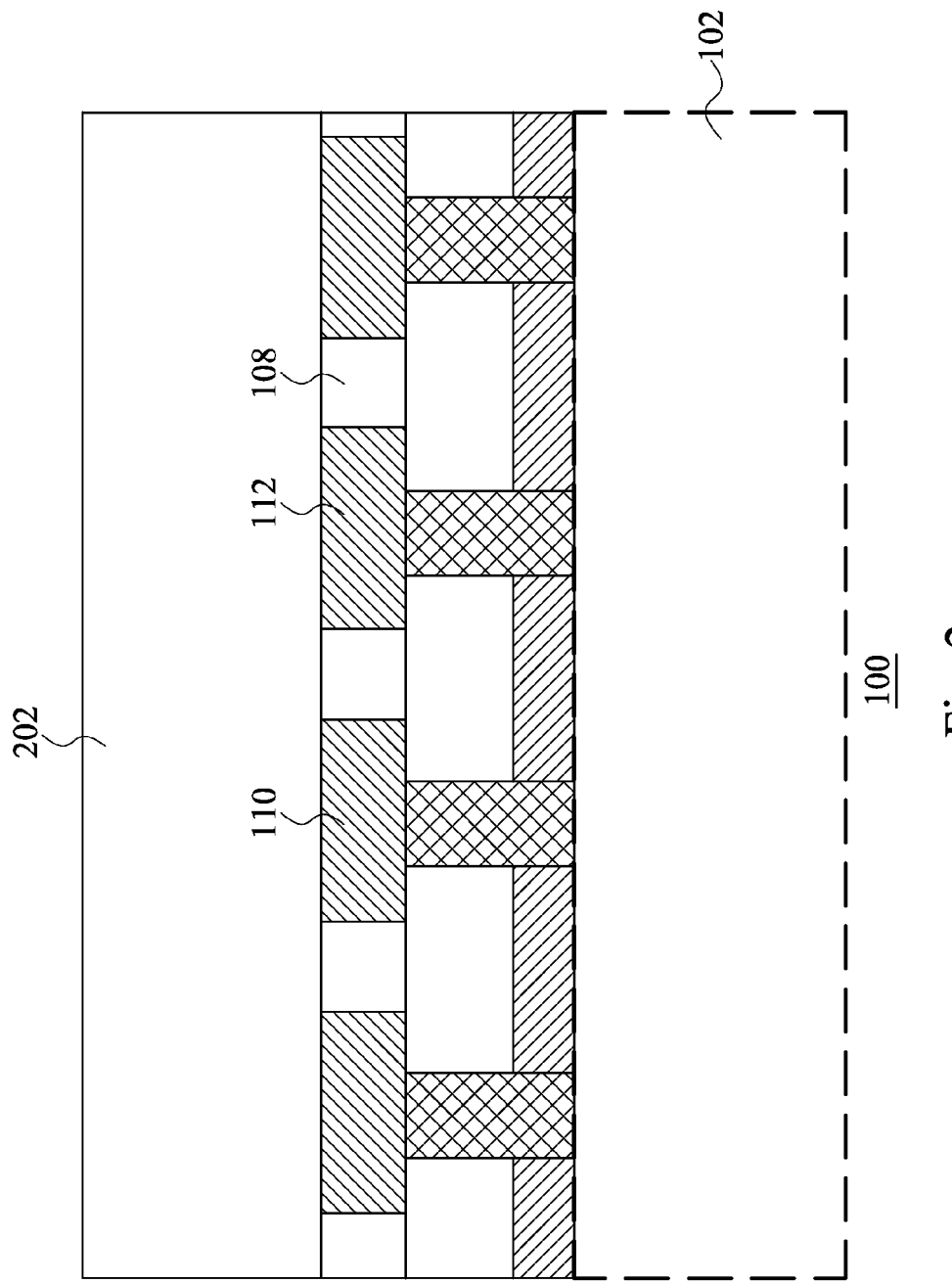

As shown in FIG. 2, a third dielectric layer 202 may be provided on the second dielectric layer 108 and the bottom electrodes 110, 112. The third dielectric layer 202 may be also provided over the substrate (not shown).

Figure 3:
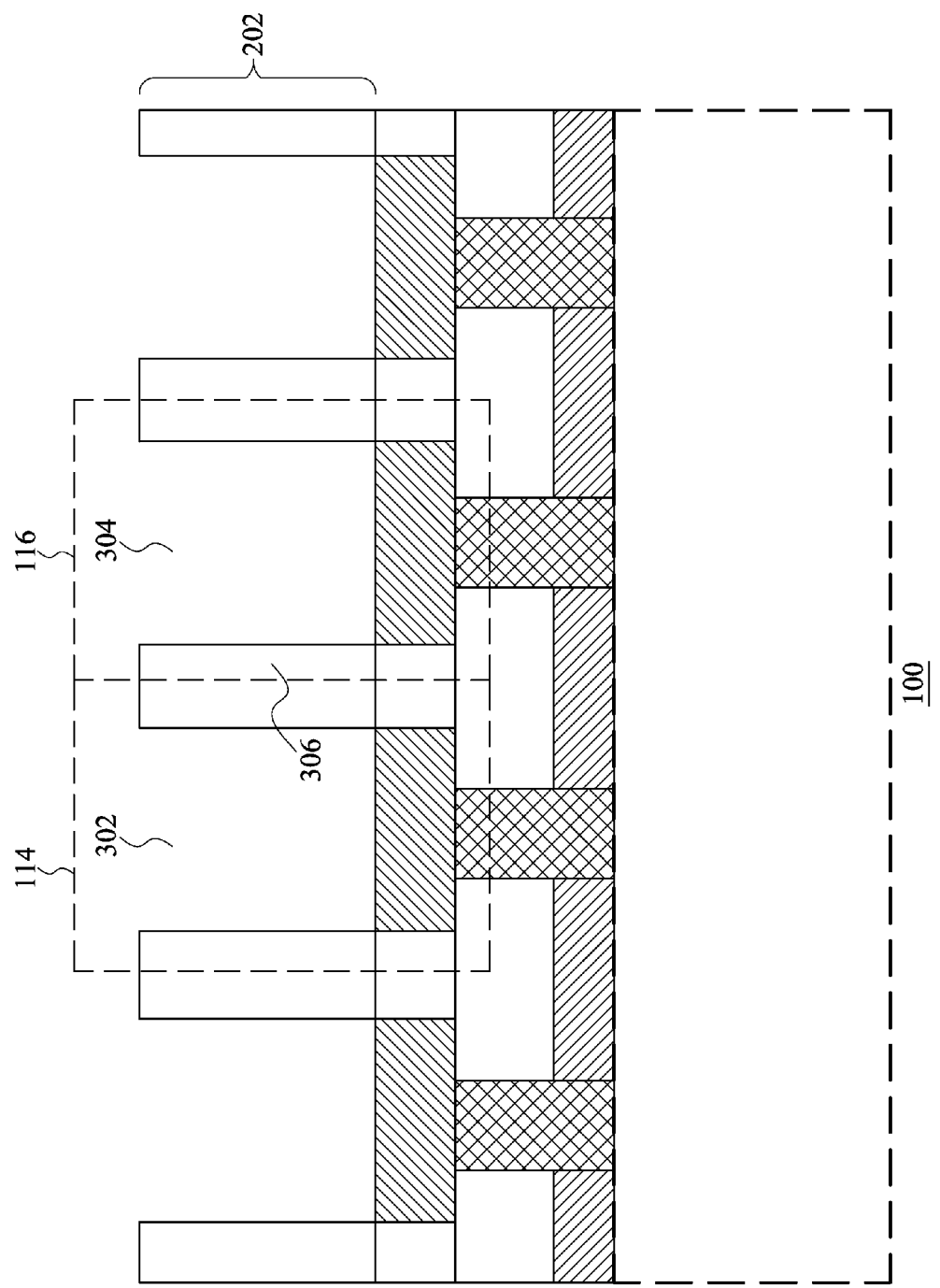

As shown in FIG. 3, a mask (not shown) may be used to define an etching region for the third dielectric layer 202. A portion of the third dielectric layer 202 may be removed by, for example, a dry etching process to form a first grid 302 corresponding to the first pixel 114 and a second grid 304 corresponding to the second pixel 116. The first grid 302 and the second grid 304 may be separated by a portion 306 of the third dielectric layer 202.

Figure 4:
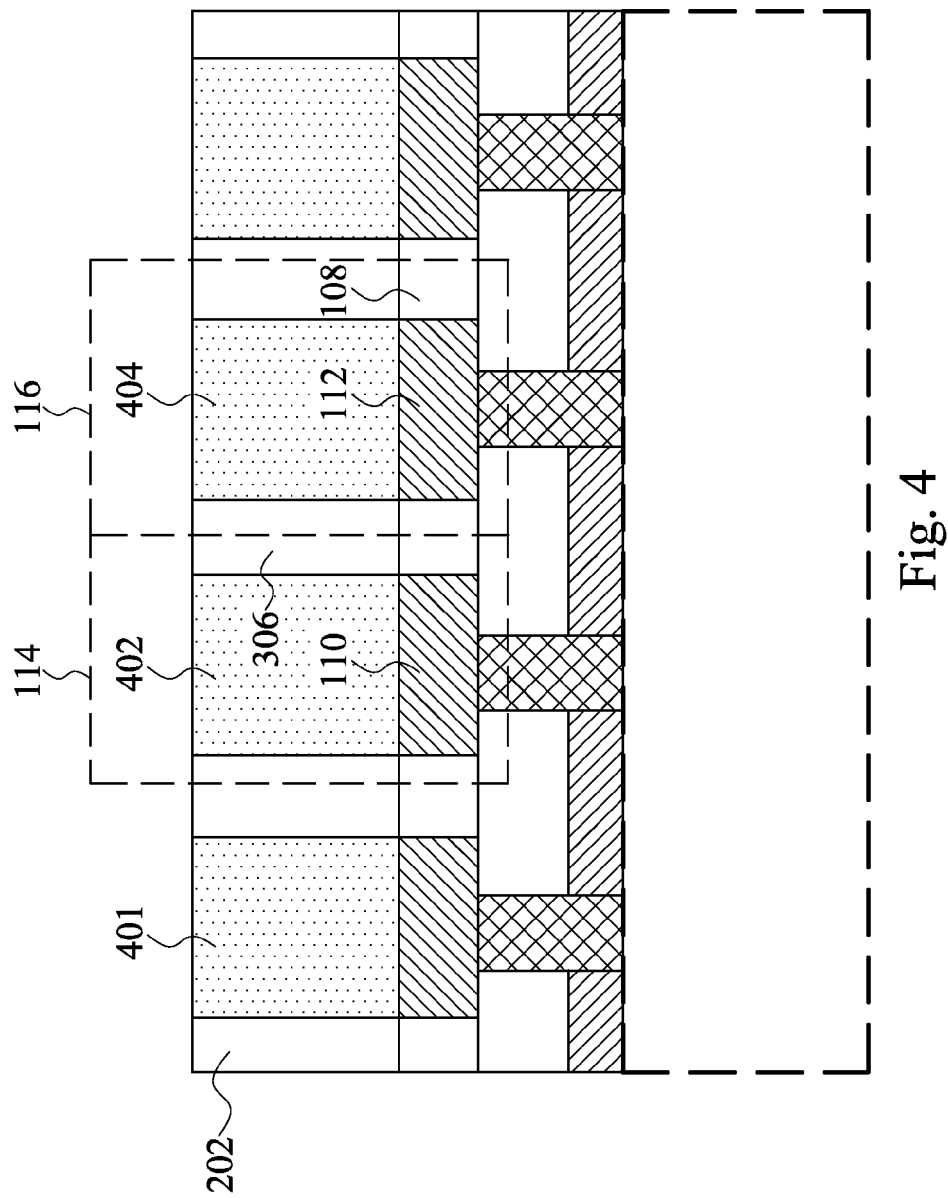

As shown in FIG. 4, a photo conversion layer 401 may be formed on the second dielectric layer 108 and the bottom electrodes 110, 112. The portion 306 of the third dielectric layer 202 defines a first portion 402 of the photo conversion layer 401 corresponding to a first pixel 114 from a second portion 404 of the photo conversion layer 401 corresponding to a second pixel 116. The photo conversion layer 401 may be organic films, such as Phenyl-C61-butyric acid methyl ester (PCBM) or poly(3-hexylthiophene) (P3HT). The refractive index of the third dielectric layer 202 is lower than the refractive index of the photo conversion layer 401. For example, the refractive index of the photo conversion layer 401 may be about 1.6 to 2, while the refractive index of the third dielectric layer 202 may be smaller than 1.5. In an embodiment of the invention, the thickness of the photo conversion layer 401 may be 100 nanometers to several micrometers.

Figure 5:
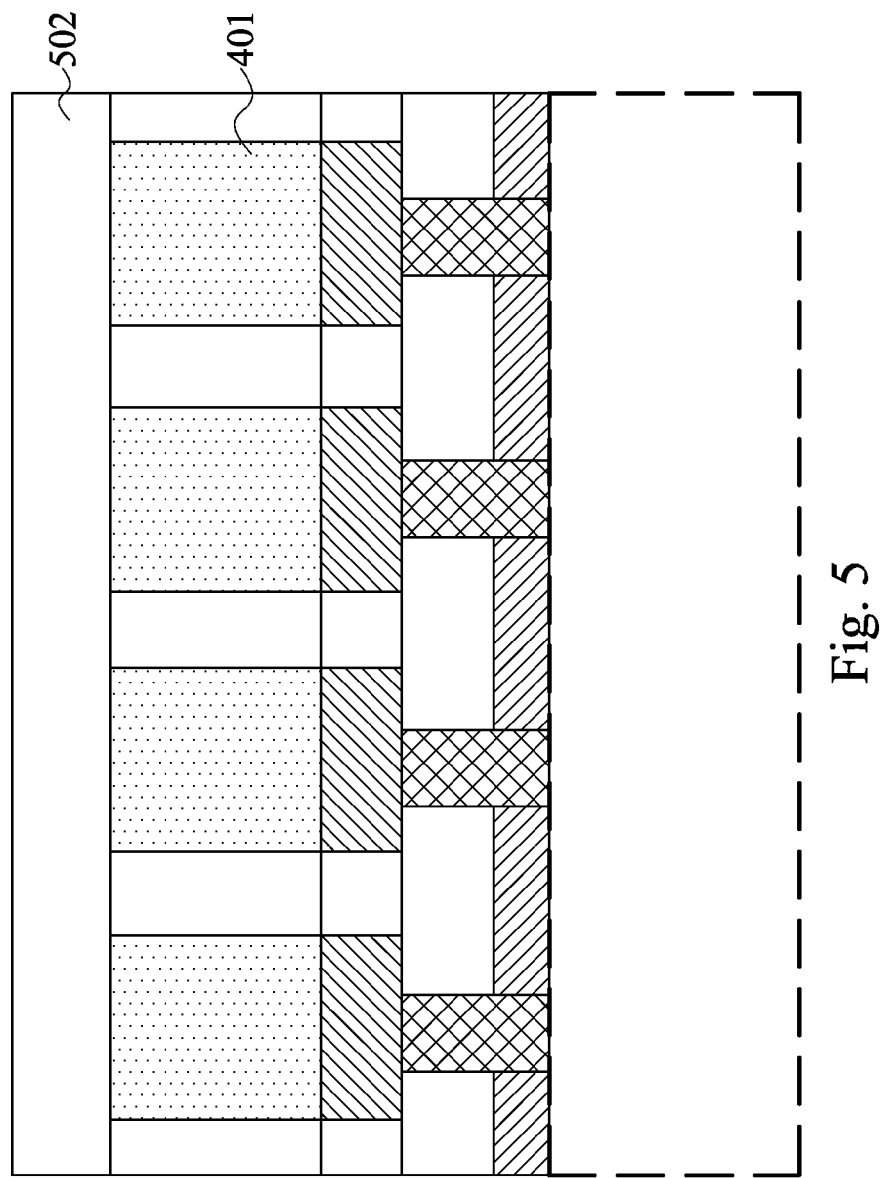

As shown in FIG. 5, a top electrode 502 may be formed over the photo conversion layer 401. The top electrode 502 may be, for example, an indium tin oxide layer. In an embodiment of the invention, the thickness of the top electrode 502 may be 50 nanometers to 500 nanometers.

Figure 6:
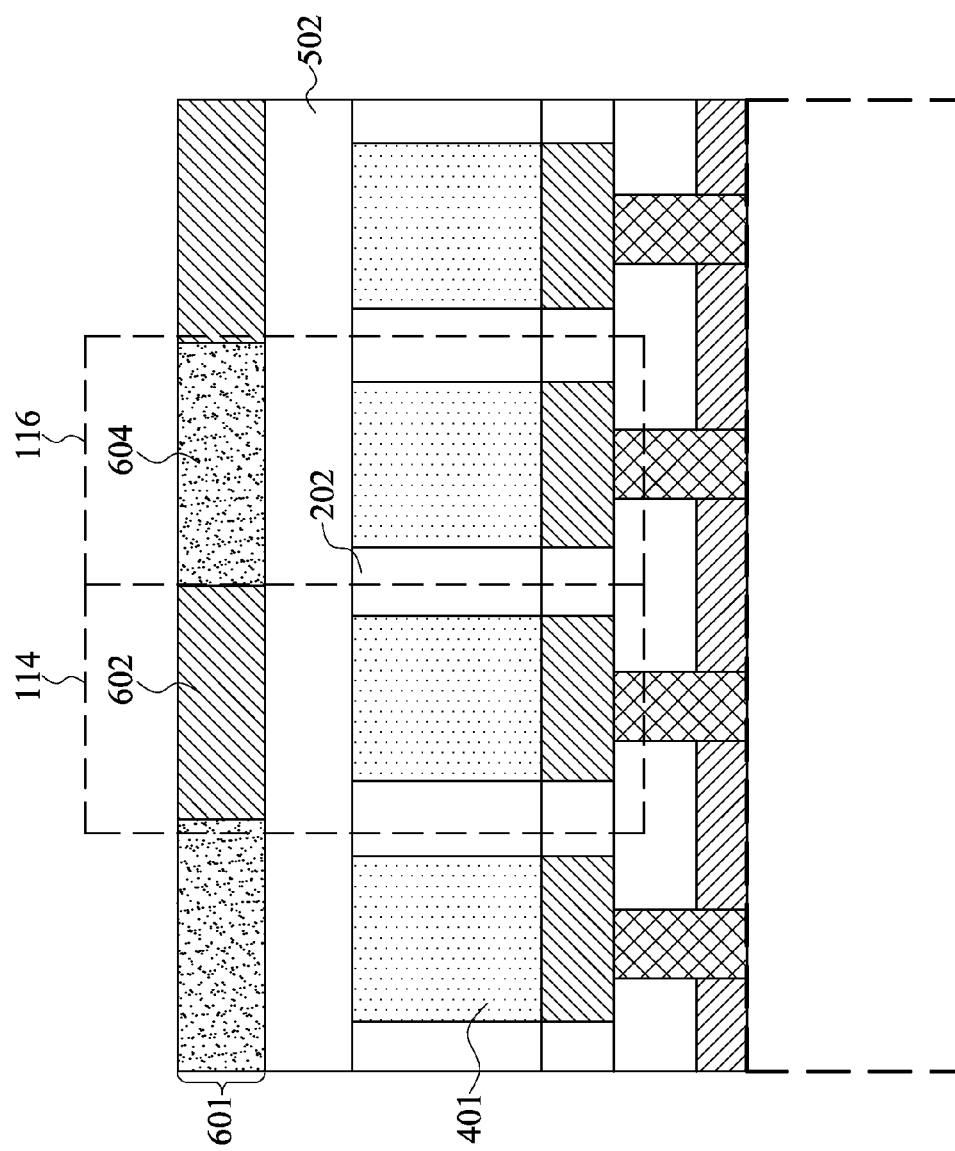

As shown in FIG. 6, a color filter layer 601 may be formed on the top electrode 502. The color filter layer 601 may also be provided over the photo conversion layer 401. In an embodiment of the invention, a first portion 602 of the color filter layer 601 corresponding to the first pixel 114 may be formed by a green filter process; and a second portion 604 of the color filter layer 601 corresponding to the second pixel 116 may be formed by a red filter process. In an embodiment of the invention, the thickness of the color filter layer 601 may be 0.3 micrometers to 1 micrometers.

Figure 7:
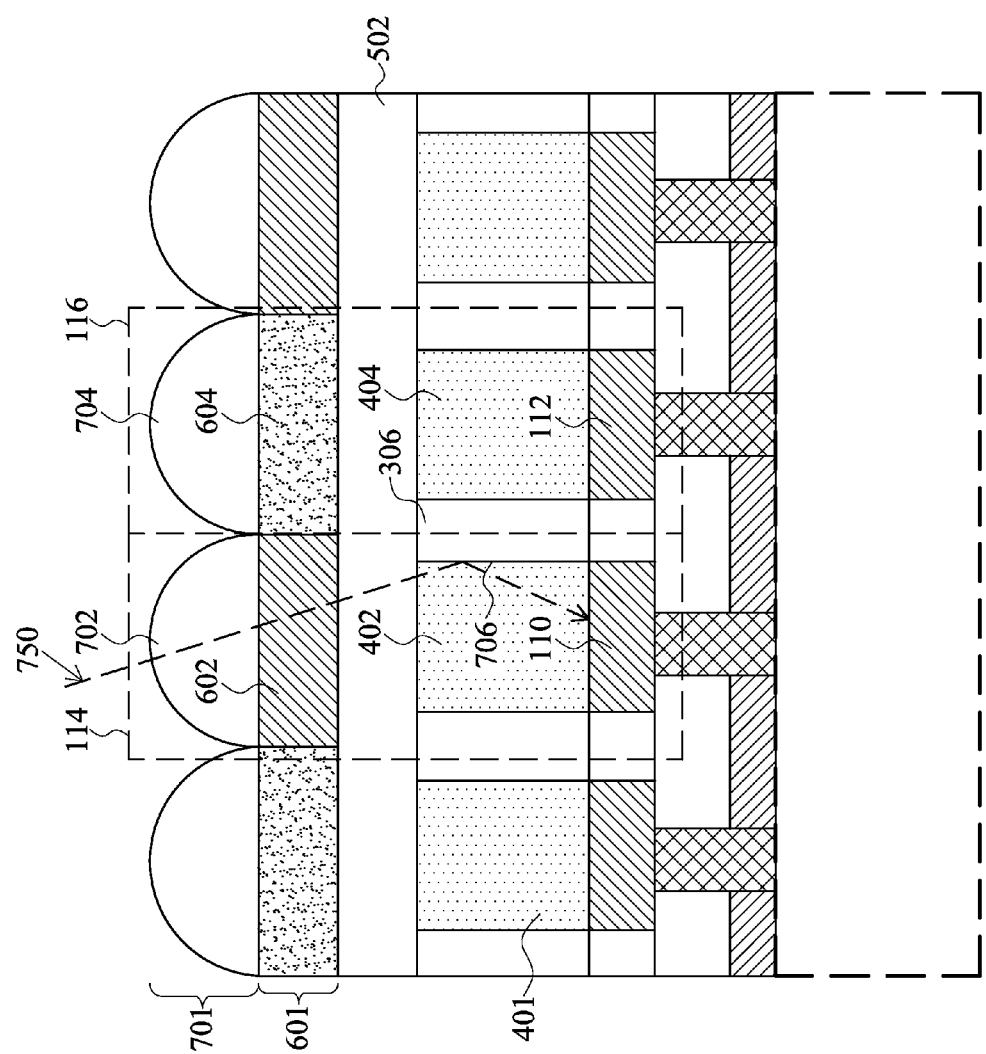

As shown in FIG. 7, a micro lens layer 701 may be formed over the color filter layer 601. A first portion 702 of the micro lens layer 701 may correspond to the first pixel 114, and a second portion 704 of the micro lens layer 701 may correspond to the second pixel 116. Bias voltage between the top electrode 502 and the bottom electrodes 110, 112 may be applied to trigger an electric field that enhances bottom electrodes 110, 112 in the collection of holes or electrons converted by the photo conversion layer 401.

Light through the first portion 702 of the micro lens layer 701, the first portion 602 of the color filter layer 601, and the first portion 402 of the photo conversion layer 401 may not pass through the second portion 404 of the photo conversion layer 401 because the portion 306 of third dielectric layer 202 separating the photo conversion layer 401 may change the direction of the light.

Total internal reflection may occur and is a phenomenon that happens when a propagating wave strikes a medium boundary at an angle larger than a particular critical angle with respect to the normal to the surface. For example, according to the formula $$\theta_c = \arcsin\frac{n_2}{n_1},$$

assuming that the refractive index (corresponding to n1 in this case) of the photo conversion layer 401 is 2 and the refractive index (corresponding to n2 in this case) of the third dielectric layer 202 is 1.5, the critical angle may be about 49 degrees.

When light 750 strikes the boundary between the photo conversion layer 401 and the portion 306 of the third dielectric layer 202 at an angle larger than the critical angle (49 degrees) with respect to the normal to the lateral surface 706 of the third dielectric layer 202, light 750 cannot pass through the portion 306 of the third dielectric layer 202 and is reflected. Therefore, light 750 through the first portion 602 of the color filter layer 601 corresponding to the first pixel 114 may not pass through the second portion 404 of the photo conversion layer 401 corresponding to the second pixel 116. The electrode 112 corresponding to the second pixel 116 may not receive holes or electrons converted from light 750 through the first pixel 114. In an embodiment of the invention, crosstalk of light between the pixels 114, 116 in the photo diode 100 may be reduced.

Figure 8:
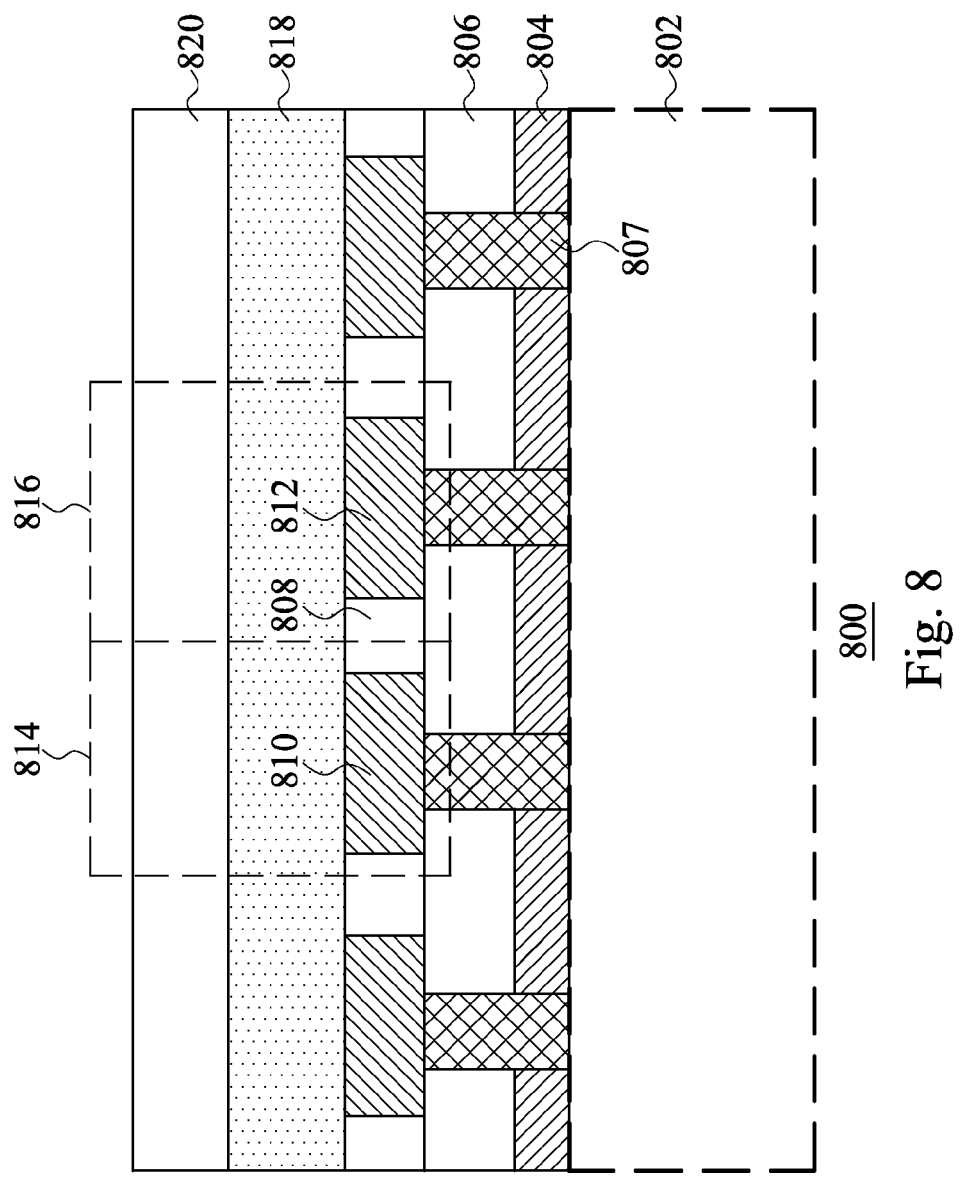
FIGS. 8-12 are exemplary diagrams during a sequence of processing stages for forming a photo diode according to a second embodiment of the invention.

FIGS. 8-12 are exemplary diagrams during a sequence of processing stages for forming a photo diode according to a second embodiment of the invention. As shown in FIG. 8, a read circuit 802 over a substrate (not shown) may be provided in the photo diode 800. A capping layer 804 for protecting vias 807 in the back end of line process may be provided over the read circuit 802. The capping layer 804 may be, for example, silicon nitride or silicon carbide. The vias 807 may be, for example, aluminum-copper or copper. A dielectric layer 806 for electric isolation between bottom electrodes 810, 812 and other metal layers (not shown) in the back end of line process may be provided over the capping layer 804. A dielectric layer 808 for electric isolation between bottom electrodes 810, 812 may be provided over the dielectric layer 806. The dielectric layers 806, 808 may be, for example, oxide or any isolation materials. The bottom electrodes 810, 812 may be any metal or alloy, such as, aluminum-copper and copper. The bottom electrode 810 may correspond to a first pixel 814 and the bottom electrode 812 may correspond to a second pixel 814.

A photo conversion layer 818 may be formed on the dielectric layer 808 and the bottom electrodes 810, 812. The photo conversion layer 818 may be organic films, such as Phenyl-C61-butyric acid methyl ester (PCBM) or poly(3-hexylthiophene) (P3HT). A top electrode 820 is formed over the photo conversion layer 818. The top electrode 820 may be, for example, an indium tin oxide layer.

Figure 9:
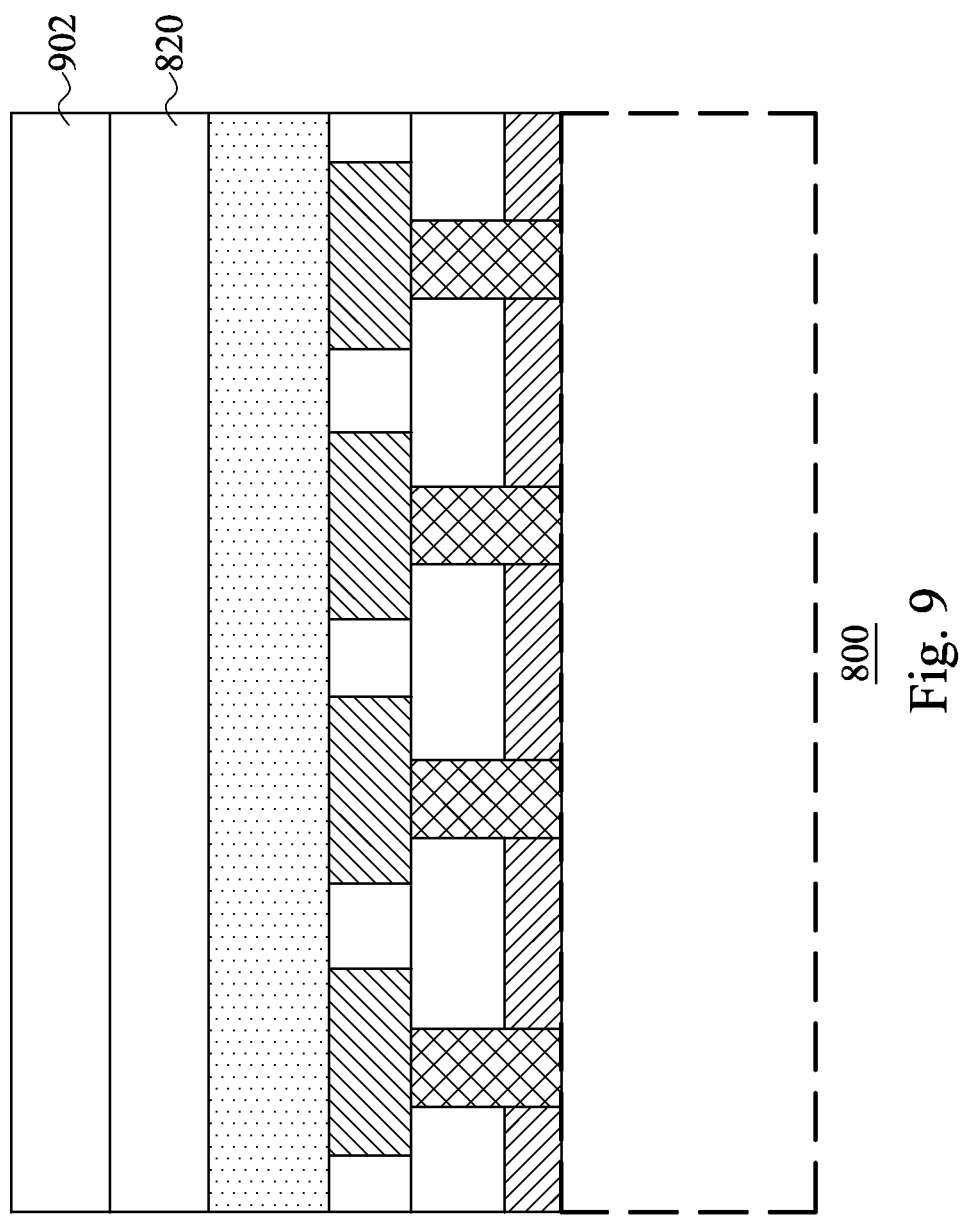
Figure 10:
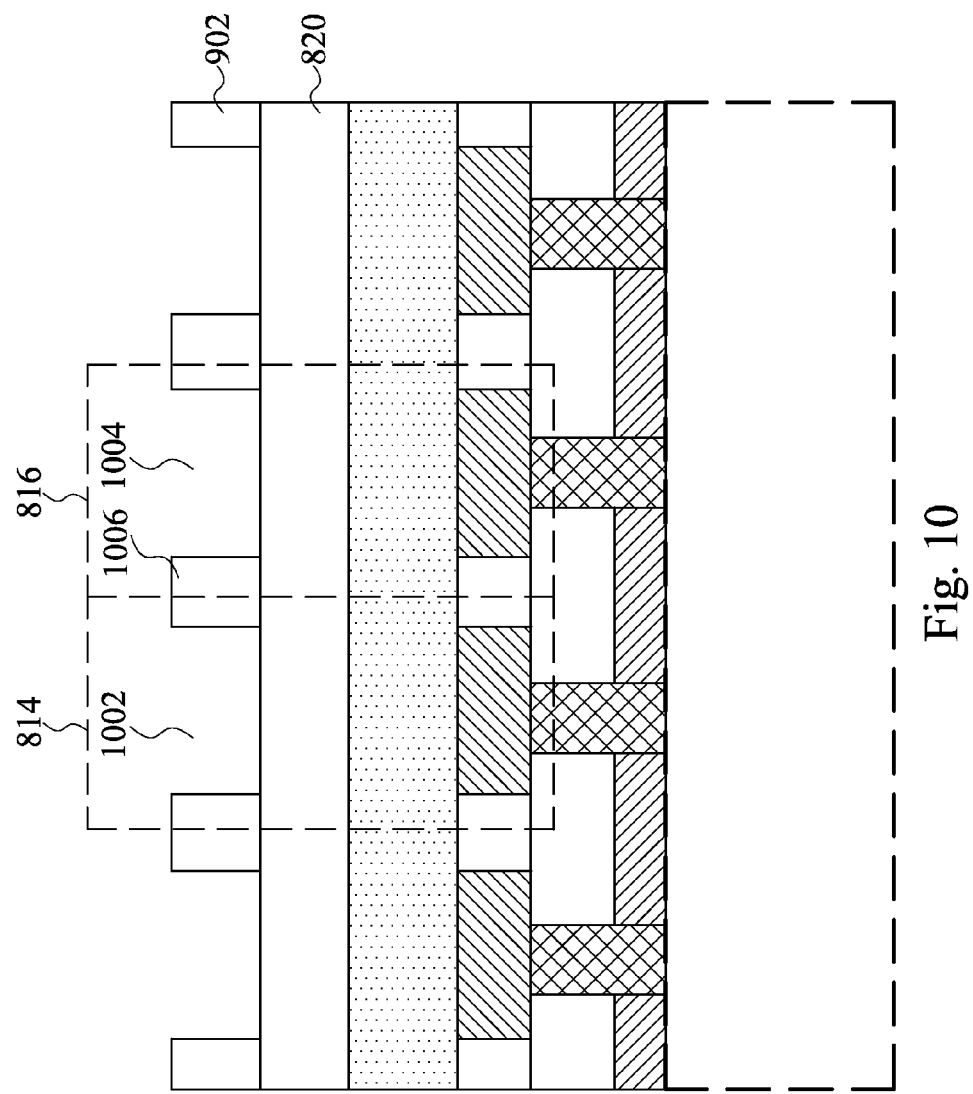

As shown in FIG. 9, a dielectric layer 902 may be provided on the top electrode 820. As shown in FIG. 10, a mask (not shown) may be used to define an etching region for the dielectric layer 902. A portion of the dielectric layer 902 may be removed by, for example, a dry etching process to form a first grid 1002 corresponding to the first pixel 814 and a second grid 1004 corresponding to the second pixel 816. The first grid 1002 and the second grid 1004 may be separated by a portion 1006 of the dielectric layer 902.

Figure 11:
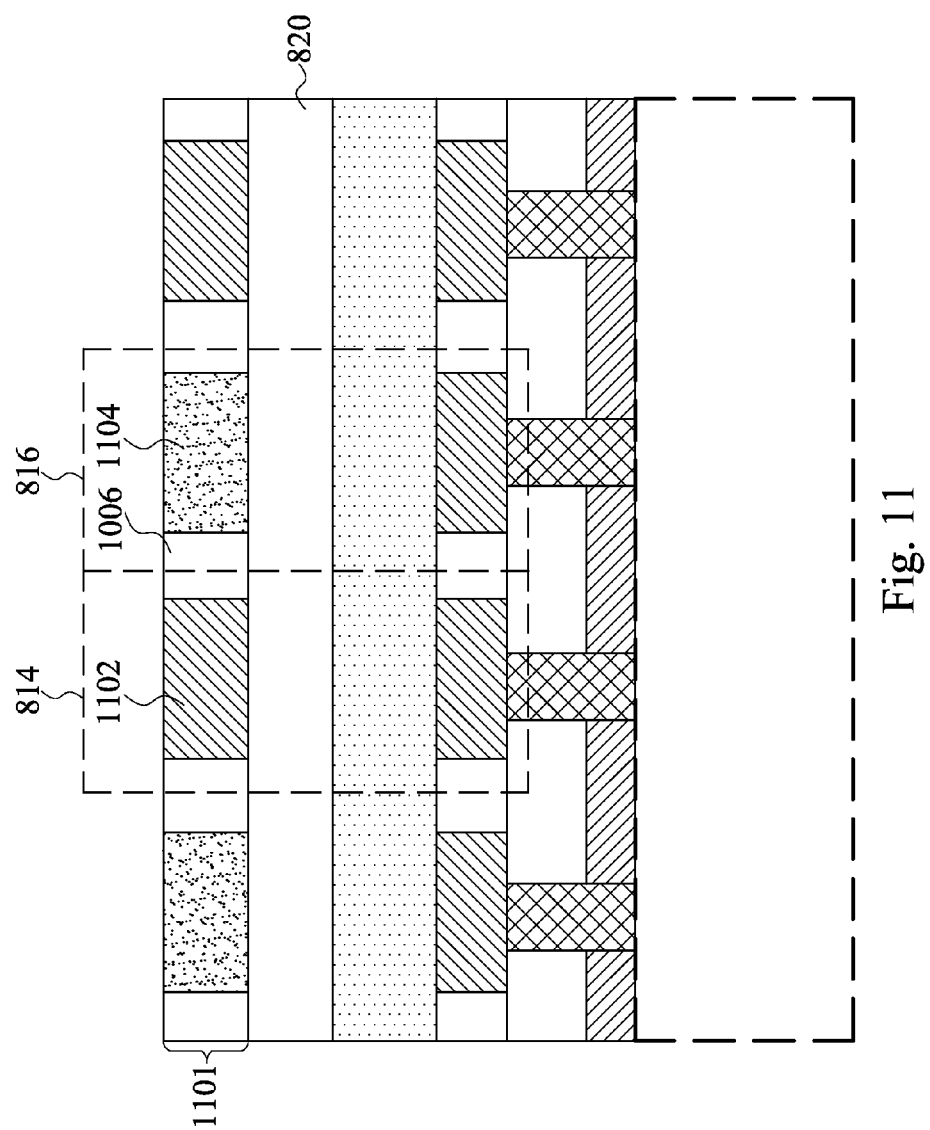

As shown in FIG. 11, a color filter layer 1101 may be formed on the top electrode 820. In an embodiment of the invention, a first portion 1102 of the color filter layer 1101 corresponding to the first pixel 814 may be formed by a green filter process; and a second portion 1104 of the color filter layer 1101 corresponding to the second pixel 816 may be formed by a red filter process. In an embodiment of the invention, the thickness of the color filter layer 1101 may be 0.3 micrometers to 1 micrometers.

The portion 1006 of the dielectric layer 902 defines the first portion 1102 of the color filter layer 1101 corresponding to a first pixel 814 from the second portion 1104 of the color filter layer 1101 corresponding to a second pixel 816. The refractive index of the dielectric layer 902 may be lower than the refractive index of the color filter layer 1101. For example, the refractive index of the color filter layer 1101 may be about 1.6 to 2, while the refractive index of the dielectric layer 902 may be smaller than 1.5.

Figure 12:
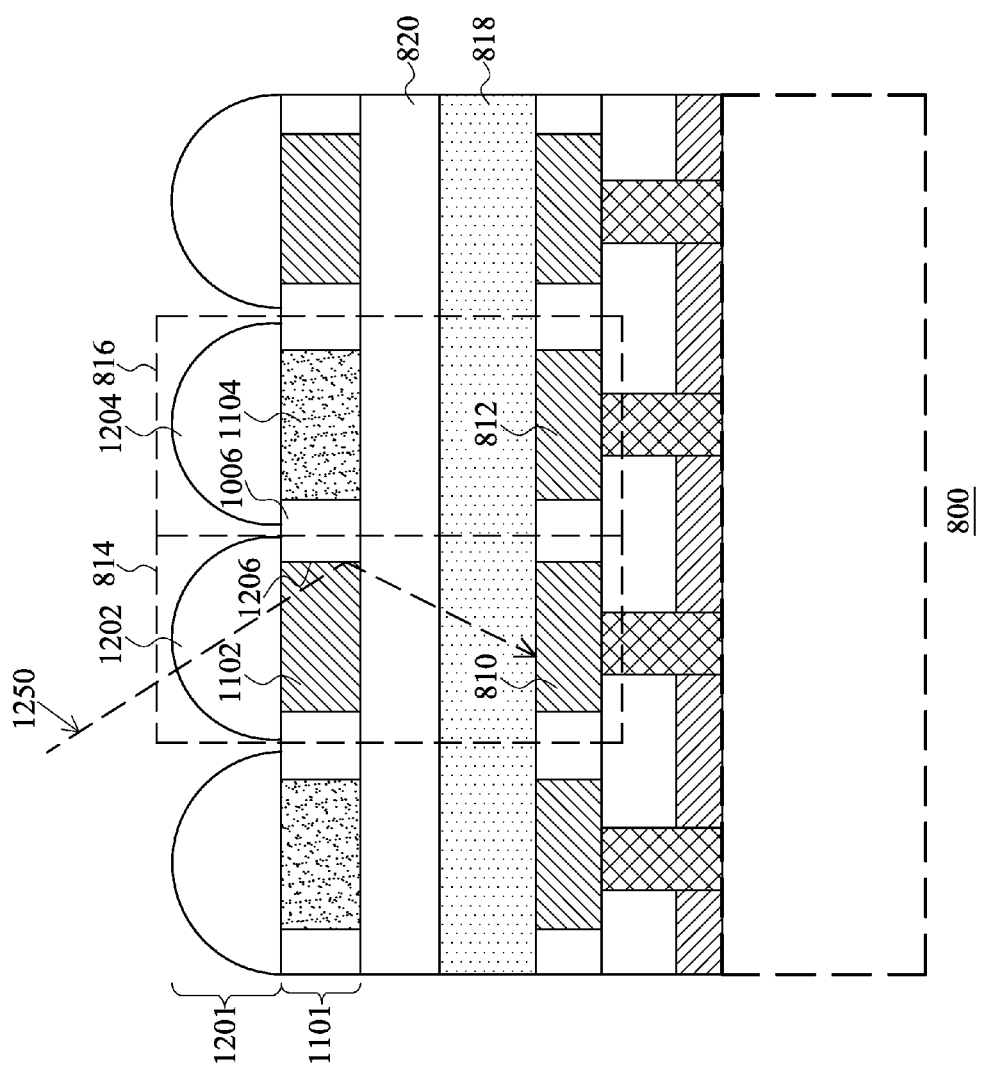

As shown in FIG. 12, a micro lens layer 1201 may be formed over the color filter layer 1101. A first portion 1202 of the micro lens layer 1201 may correspond to a first pixel 814, and a second portion 1204 of the micro lens layer 1201 may correspond to a second pixel 816. In an embodiment of the invention, the photo diode 800 is formed. Bias voltage between the top electrode 802 and the bottom electrodes 810, 812 may be applied to trigger an electric field that enhances bottom electrodes 810, 812 in the collection of holes or electrons converted by the photo conversion layer 818.

Light through the first portion 1202 of the micro lens layer 1201 and the first portion 1102 of the color filter layer 1101 may not pass through the second portion 1104 of the color filter layer 1101 because the portion 1006 of dielectric layer 902 separating the color filter layer 1101 may changes the direction of light.

Total internal reflection may occur and is a phenomenon that happens when a propagating wave strikes a medium boundary at an angle larger than a particular critical angle with respect to the normal to the surface. For example, according to the formula $$\theta_c = \arcsin\frac{n_2}{n_1},$$

assuming that the refractive index (corresponding to n1 in this case) of the color filter layer 1101 is 2 and the refractive index (corresponding to n2 in this case) of the dielectric layer 902 is 1.5, the critical angle may be about 49 degrees. When light 1250 strikes the boundary between the color filter layer 1101 and the portion 1006 of dielectric layer 902 at an angle larger than the critical angle (49 degrees) with respect to the normal to the lateral surface 1206 of the dielectric layer 902, light 1250 cannot pass through the portion 1006 of dielectric layer 902 and is reflected.

Therefore, light 1250 through the first portion 1102 of the color filter layer 1101 corresponding to the first pixel 814 may not pass through a portion of photo conversion layer 818 corresponding to the second pixel 816. The electrode 812 corresponding to the second pixel 816 may not receive holes or electrons converted from light 1250 through the first pixel 814. In an embodiment of the invention, crosstalk of light between the pixels 814, 816 in the photo diode 800 may be reduced.

Figure 13:
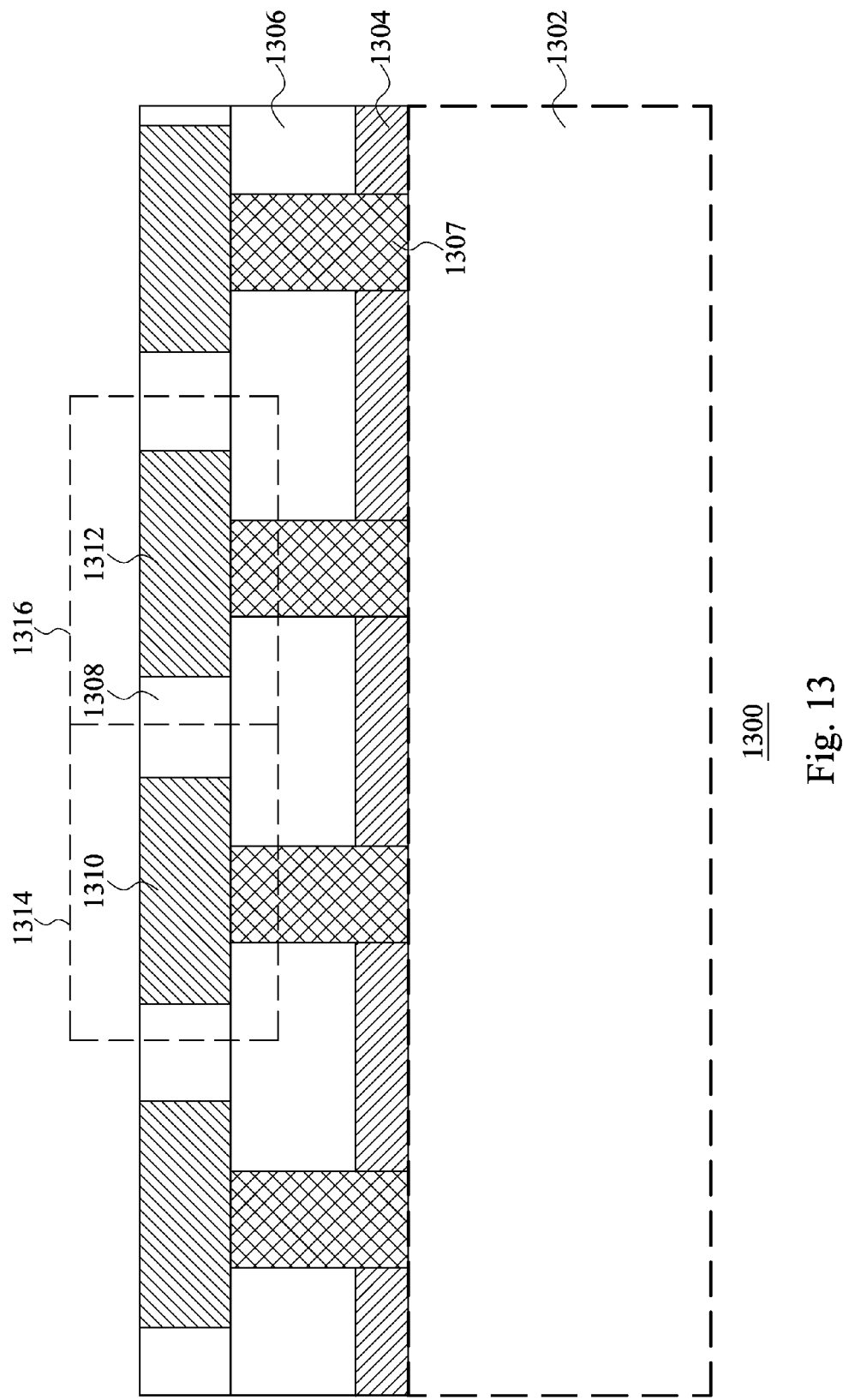
FIGS. 13-21 are exemplary diagrams during a sequence of processing stages for forming a photo diode according to a third embodiment of the invention.

FIGS. 13-21 are exemplary diagrams during a sequence of processing stages for forming a photo diode according to a third embodiment of the invention. As shown in FIG. 13, a read circuit 1302 over a substrate (not shown) may be provided in a photo diode 1300. A capping layer 1304 for protecting vias 1307 in the back end of line process may be provided over the read circuit 1302. The capping layer 1304 may be, for example, silicon nitride or silicon carbide. The vias 1307 may be, for example, aluminum-copper or copper. A dielectric layer 1306 for electric isolation between bottom electrodes 1310, 1312 and other metal layers (not shown) in the back end of line process may be provided over the capping layer 1304. A dielectric layer 1308 for electric isolation between bottom electrodes 1310, 1312 may be provided over the dielectric layer 1306. The dielectric layers 1306, 1308 may be, for example, oxide or any isolation materials. The bottom electrodes 1310, 1312 may be any metal or alloy, such as, aluminum-copper and copper. The first bottom electrode 1310 may correspond to a first pixel 1314 and the second bottom electrode 1312 may correspond to a second pixel 1316.

Figure 14:
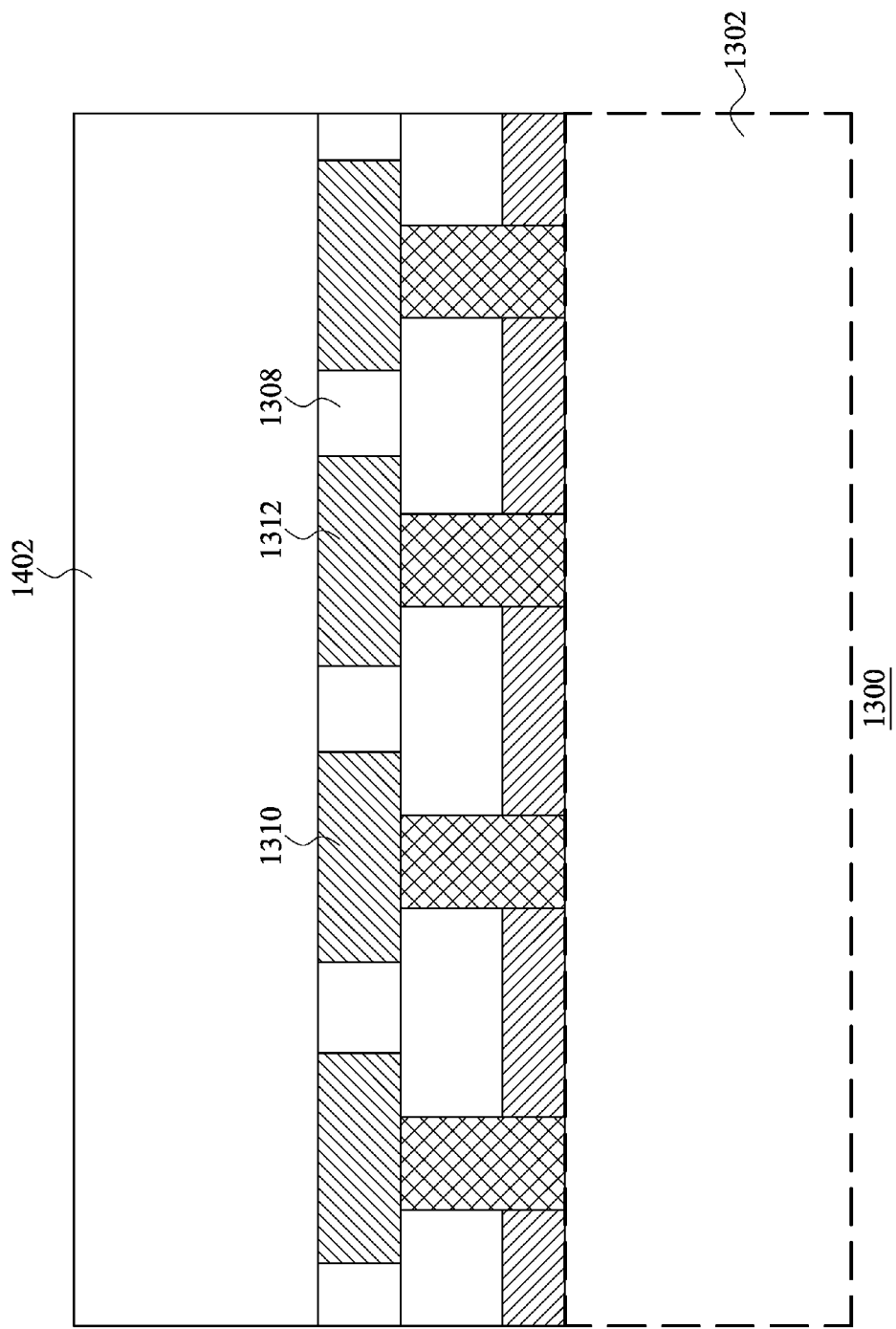

As shown in FIG. 14, a dielectric layer 1402 may be provided on the dielectric layer 1308 and the bottom electrodes 1310, 1312. The dielectric layer 1402 may be also provided over the substrate (not shown).

Figure 15:
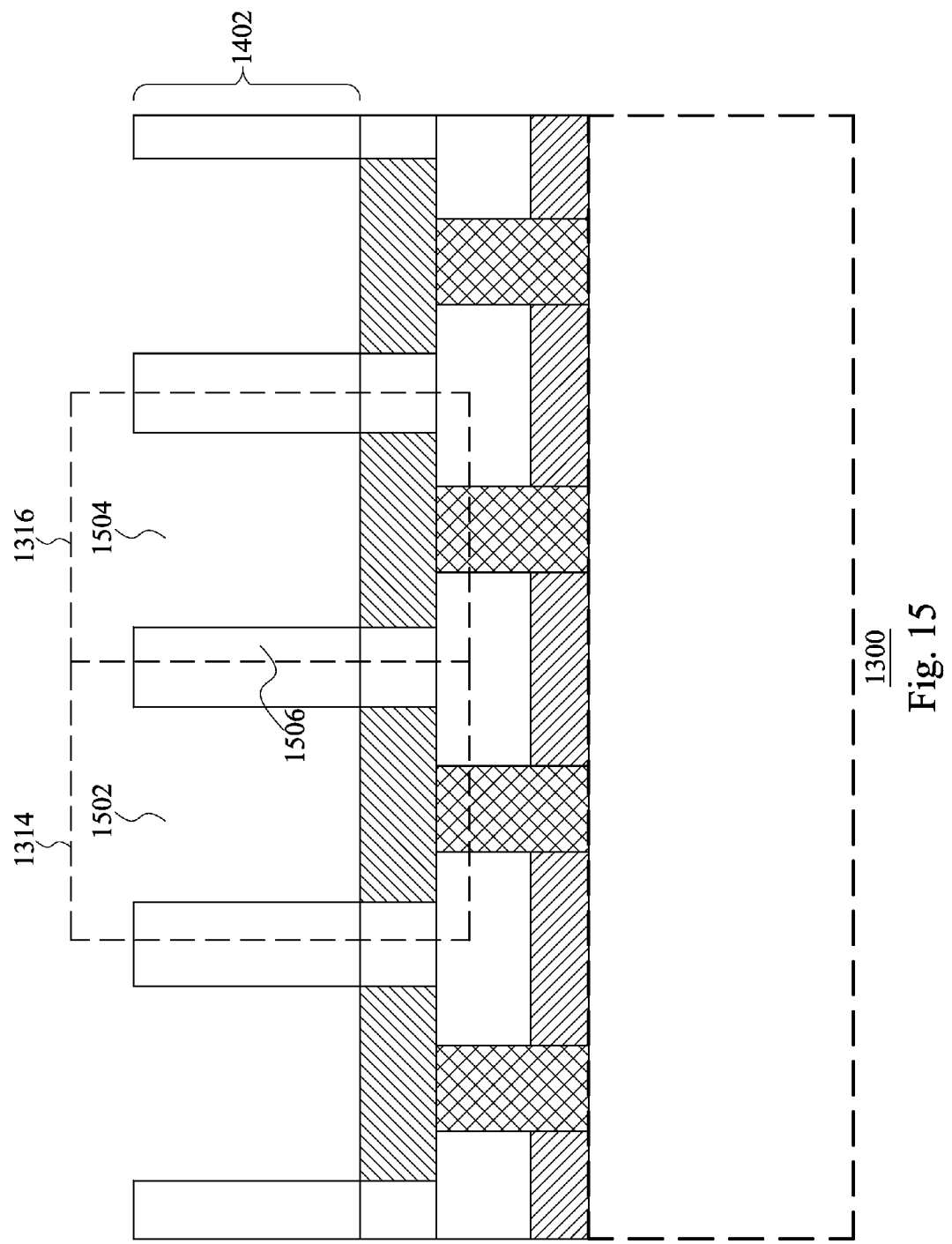

As shown in FIG. 15, a mask (not shown) may be used to define an etching region for the dielectric layer 1402. A portion of the dielectric layer 1402 may be removed by, for example, a dry etching process to form a first grid 1502 of the dielectric layer 1402 corresponding to the first pixel 1314 and a second grid 1504 of the dielectric layer 1402 corresponding to the second pixel 1316. The first grid 1502 of the dielectric layer 1402 and the second grid 1504 of the dielectric layer 1402 may be separated by a portion 1506 of the dielectric layer 1402.

Figure 16:
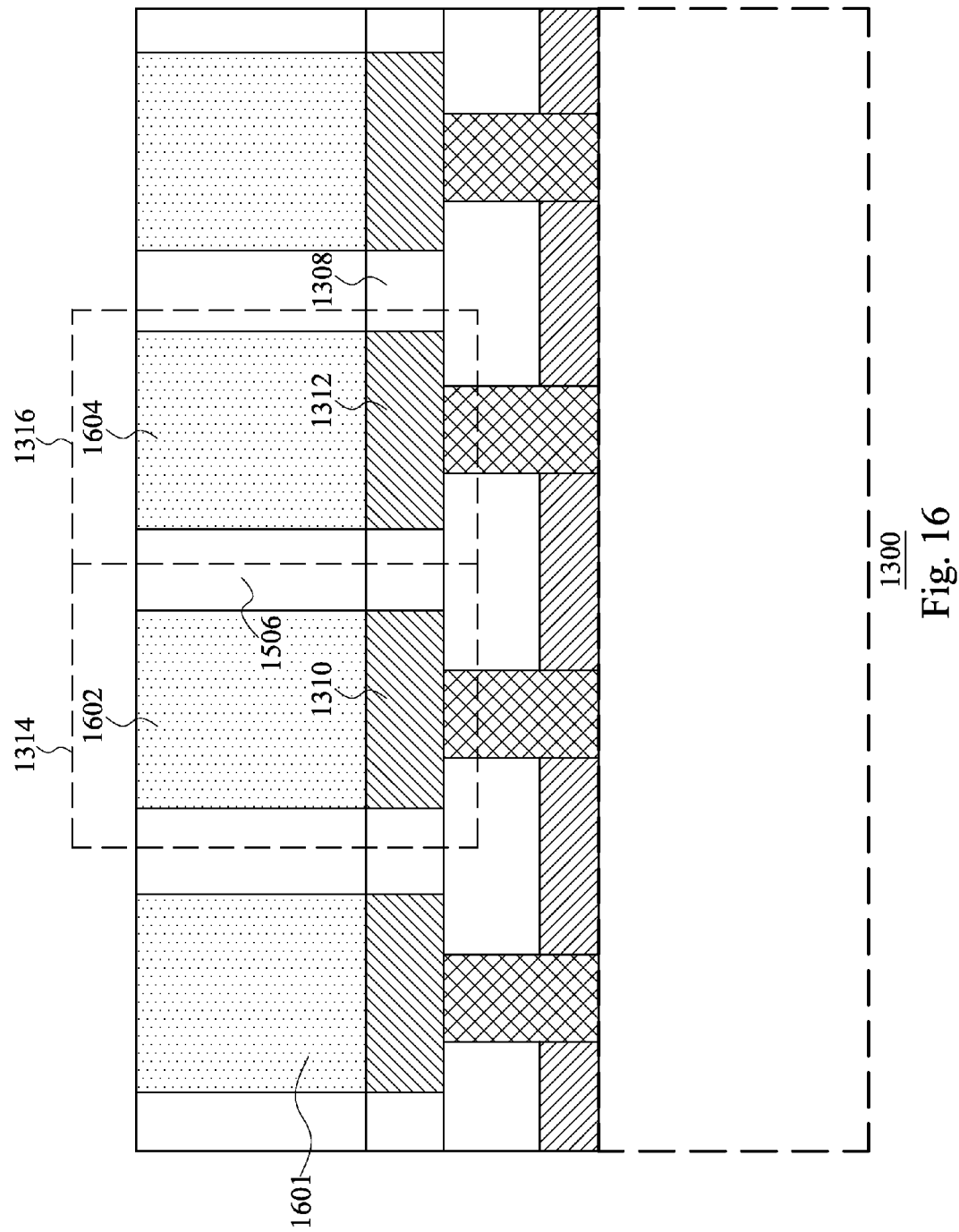

As shown in FIG. 16, a photo conversion layer 1601 may be formed on the dielectric layer 1308 and the bottom electrodes 1310, 1312. The photo conversion layer 1601 may be provided over the substrate (not shown). The portion 1506 of the dielectric layer 1402 defines a first portion 1602 of the photo conversion layer 1601 corresponding to a first pixel 1314 from a second portion 1604 of the photo conversion layer 1601 corresponding to a second pixel 1316. The photo conversion layer 1601 may be organic films, such as Phenyl-C61-butyric acid methyl ester (PCBM) or poly(3-hexylthiophene) (P3HT). The refractive index of the dielectric layer 1402 may be lower than the refractive index of the photo conversion layer 1601. For example, the refractive index of the photo conversion layer 1601 may be about 1.6 to 2, while the refractive index of the dielectric layer 1402 may be smaller than 1.5. In an embodiment of the invention, the thickness of the photo conversion layer 1601 may be 100 nanometers to several micrometers.

Figure 17:
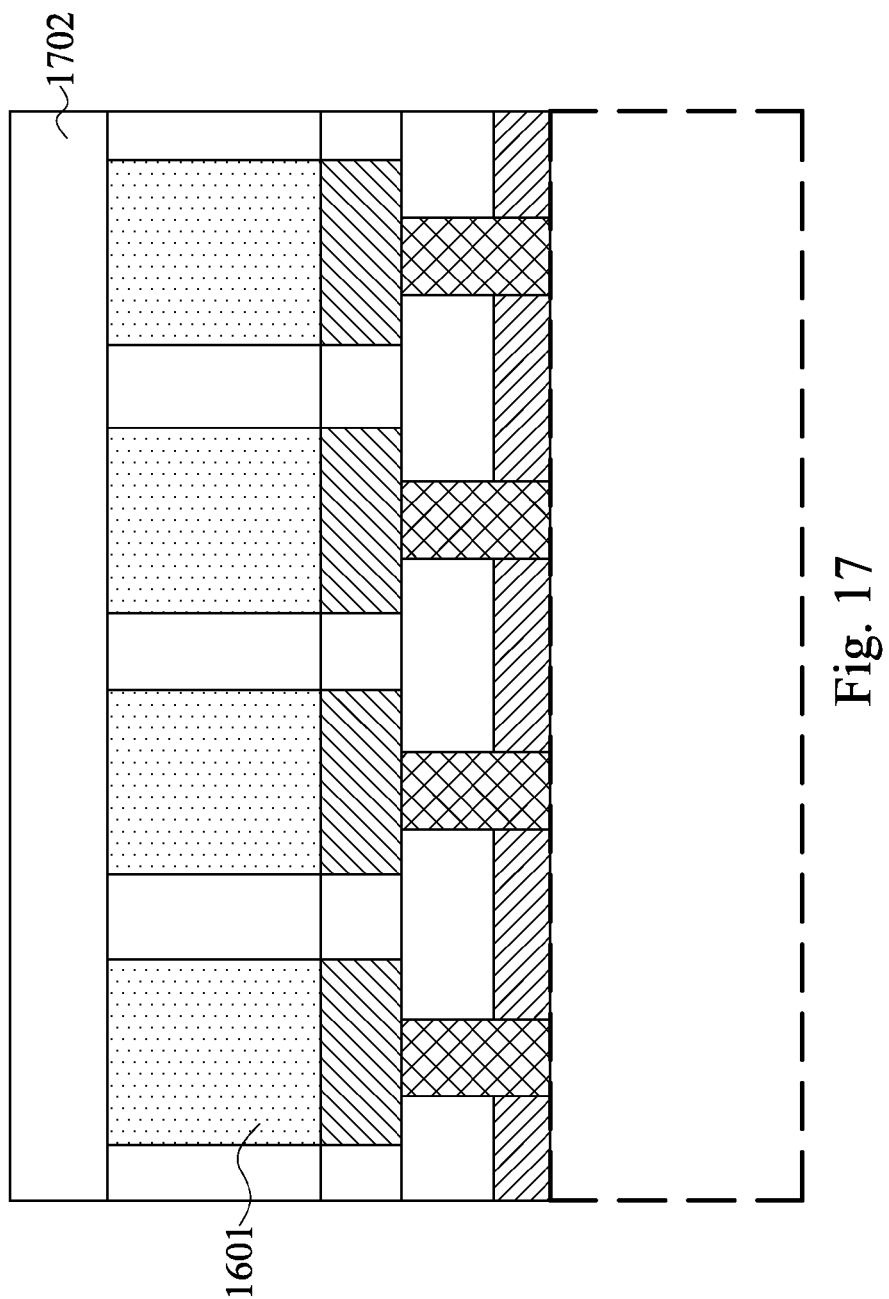

As shown in FIG. 17, a top electrode 1702 is formed over the photo conversion layer 1601. The top electrode 1702 may be an indium tin oxide layer. In an embodiment of the invention, the thickness of the top electrode 1702 may be 50 nanometers to 500 nanometers.

Figure 18:
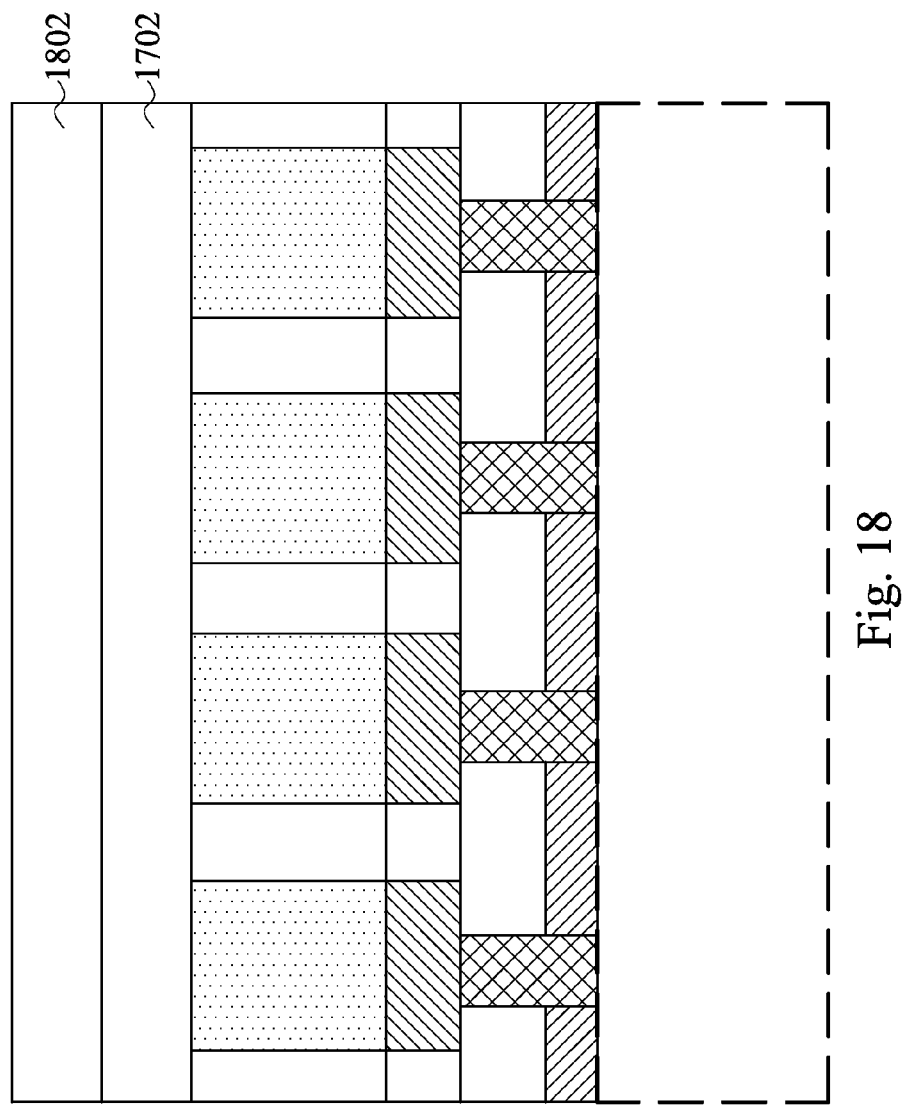

As shown in FIG. 18, a dielectric layer 1802 may be provided on the top electrode 1702.

Figure 19:
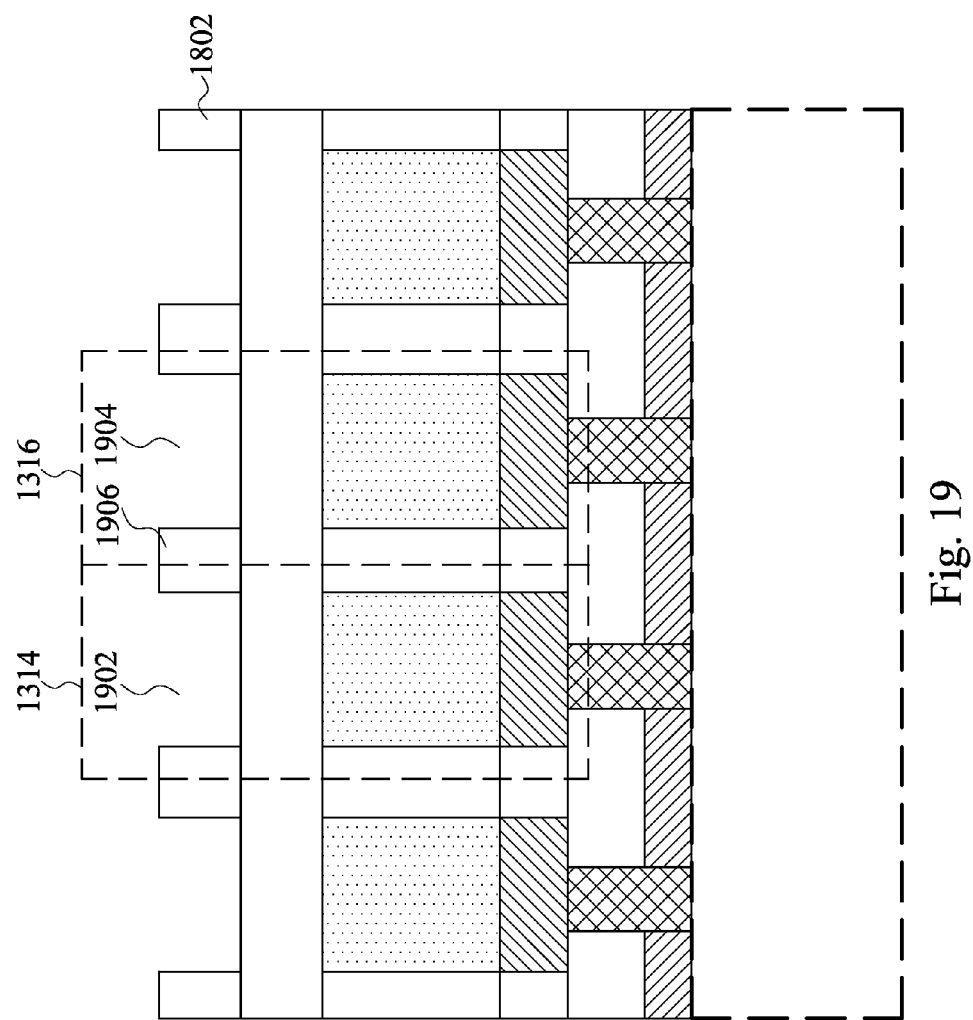

As shown in FIG. 19, a mask (not shown) may be used to define an etching region for the dielectric layer 1802. A portion of the dielectric layer 1802 may be removed by, for example, a dry etching process to form a first grid 1902 of the dielectric layer 1802 corresponding to the first pixel 1314 and a second grid 1904 of the dielectric layer 1802 corresponding to the second pixel 1316. The first grid 1902 of the dielectric layer 1802 and the second grid 1904 of the dielectric layer 1802 are separated by a portion 1906 of the dielectric layer 1802.

Figure 20:
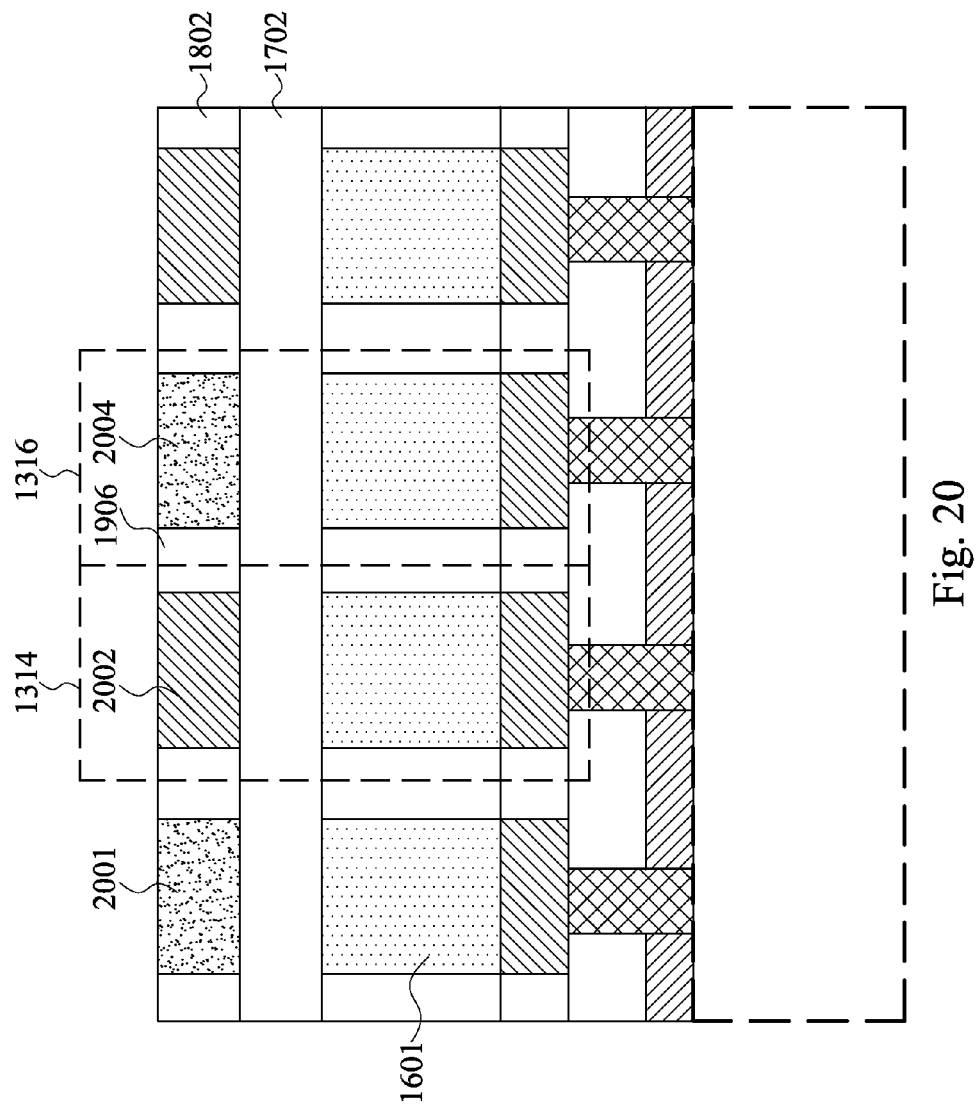

As shown in FIG. 20, a color filter layer 2001 may be formed on the top electrode 1702 In an embodiment of the invention, a first portion 2002 of the color filter layer 2001 corresponding to the first pixel 1314 may be formed by a green filter process; and a second portion 2004 of the color filter layer 2001 corresponding to the second pixel 1316 may be formed by a red filter process. In an embodiment of the invention, the thickness of the color filter layer 2001 may be 0.3 micrometers to 1 micrometers.

The portion 1906 of the dielectric layer 1802 defines a first portion 2002 of the color filter layer 2001 corresponding to a first pixel 1314 from a second portion 2004 of the color filter layer 2001 corresponding to a second pixel 1316. The refractive index of the dielectric layer 1802 is lower than the refractive index of the color filter layer 2001. For example, the refractive index of the color filter layer 2001 may be about 1.6 to 2, while the refractive index of the dielectric layer 1802 may be smaller than 1.5.

Figure 21:
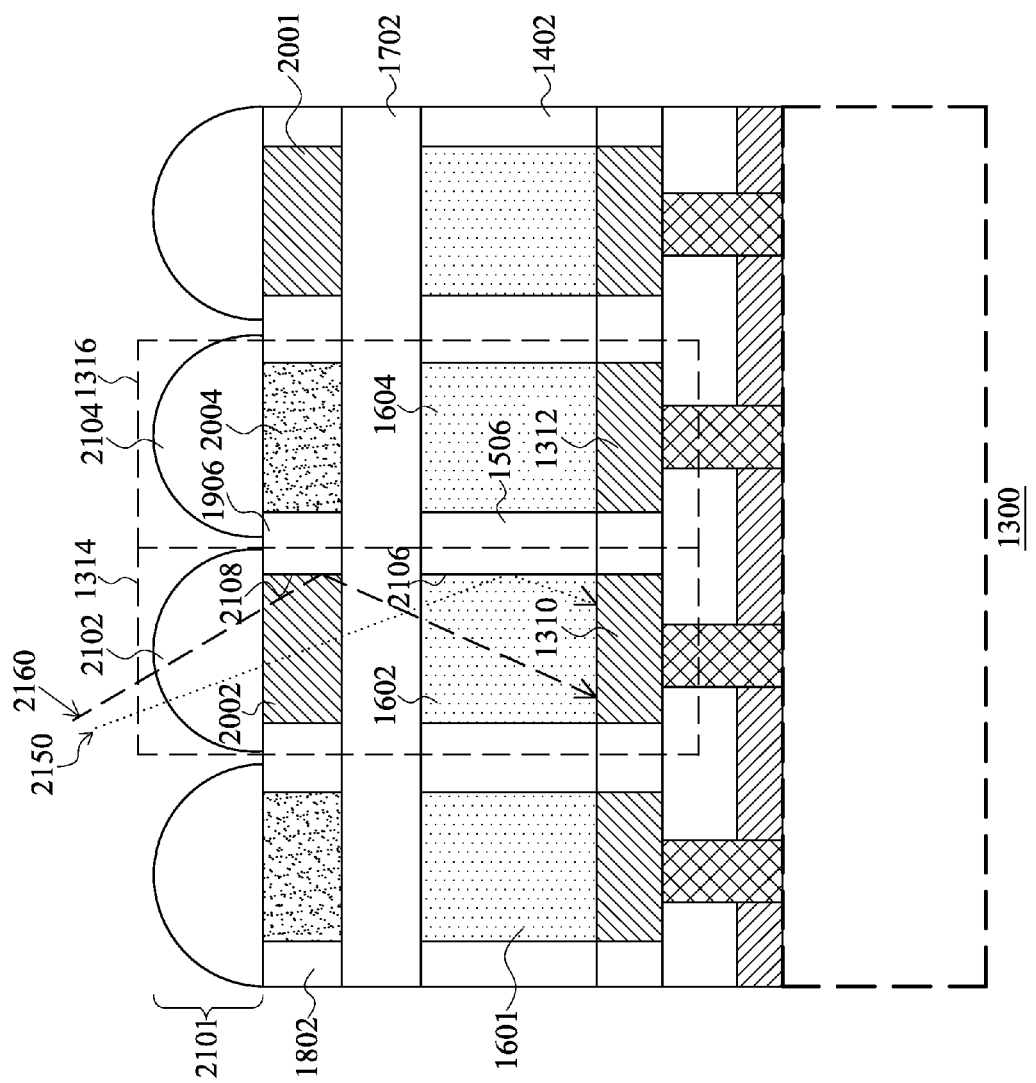

As shown in FIG. 21, a micro lens layer 2101 is formed over the color filter layer 2001. A first portion 2102 of the micro lens layer 2101 may correspond to a first pixel 1314, and the second portion 2104 of the micro lens layer 2101 may correspond to a second pixel 1316. In an embodiment of the invention, the photo diode 1300 is formed. Bias voltage between the top electrode 1702 and the bottom electrodes 1310, 1312 may be applied to trigger an electric field that enhances bottom electrodes 1310, 1312 in the collection of holes or electrons converted by the photo conversion layer 1601.

Light through the first portion 2102 of the micro lens layer 2101, the first portion 2002 of the color filter layer 2001 and the first portion 1602 of the photo conversion layer 1601 may not pass through the second portion 1604 of the photo conversion layer 1601 because the portion 1506 of dielectric layer 1402 separating the photo conversion layer 1601 may change the direction of the light.

Total internal reflection may occur and is a phenomenon that happens when a propagating wave strikes a medium boundary at an angle larger than a particular critical angle with respect to the normal to the surface. For example, according to the formula $$\theta_c = \arcsin\frac{n_2}{n_1},$$

assuming that the refractive index (corresponding to n1 in this case) of the photo conversion layer 1601 is 2 and the refractive index (corresponding to n2 in this case) of the dielectric layer 1402 is 1.5, the critical angle may be about 49 degrees. When light 2150 strikes the boundary between the photo conversion layer 1601 and the portion 1506 of dielectric layer 1402 at an angle larger than the critical angle (49 degrees) with respect to the normal to the lateral surface 2106 of the dielectric layer 1402, light 2150 cannot pass through the portion 1506 of dielectric layer 1402 and is reflected. Therefore, light 2150 through the first portion 2002 of the color filter layer 2001 corresponding to the first pixel 1314 may not pass through the second portion 1604 of the photo conversion layer 1601 corresponding to the second pixel 1316. The electrode 1312 corresponding to the second pixel 1316 may not receive holes or electrons converted from light 2150 through the first pixel 1314. In an embodiment of the invention, crosstalk of light between the pixels 1314, 1316 in the photo diode 1300 may be reduced.

Light through the first portion 2102 of the micro lens layer 2101 and the first portion 2002 of the color filter layer 2001 may not pass through the second portion 2004 of the color filter layer 2001 because the portion 1906 of dielectric layer 1802 separating the color filter layer 1101 may changes the direction of light.

In an embodiment of the invention, according to the formula $$\theta_c = \arcsin\frac{n_2}{n_1},$$

assuming that the refractive index (corresponding to n1 in this case) of the color filter layer 2001 is 2 and the refractive index (corresponding to n2 in this case) of the dielectric layer 1802 is 1.5, the critical angle may be about 49 degrees. When light 2160 strikes the boundary between the color filter layer 2001 and the portion 1906 of dielectric layer 1802 at an angle larger than the critical angle (49 degrees) with respect to the normal to the lateral surface 2108 of the dielectric layer 1802, light 2160 cannot pass through the portion 1906 of dielectric layer 1802 and is reflected.

Therefore, light 2160 through the first portion 2002 of the color filter layer 2001 corresponding to the first pixel 1314 may not pass through the portion 1604 of photo conversion layer 1402 corresponding to the second pixel 1316. The electrode 1312 corresponding to the second pixel 1316 may not receive holes or electrons converted from light 2160 through the first pixel 1314. In an embodiment of the invention, crosstalk of light between the pixels 1314, 1316 in the photo diode 800 may be also reduced.

Figure 22:
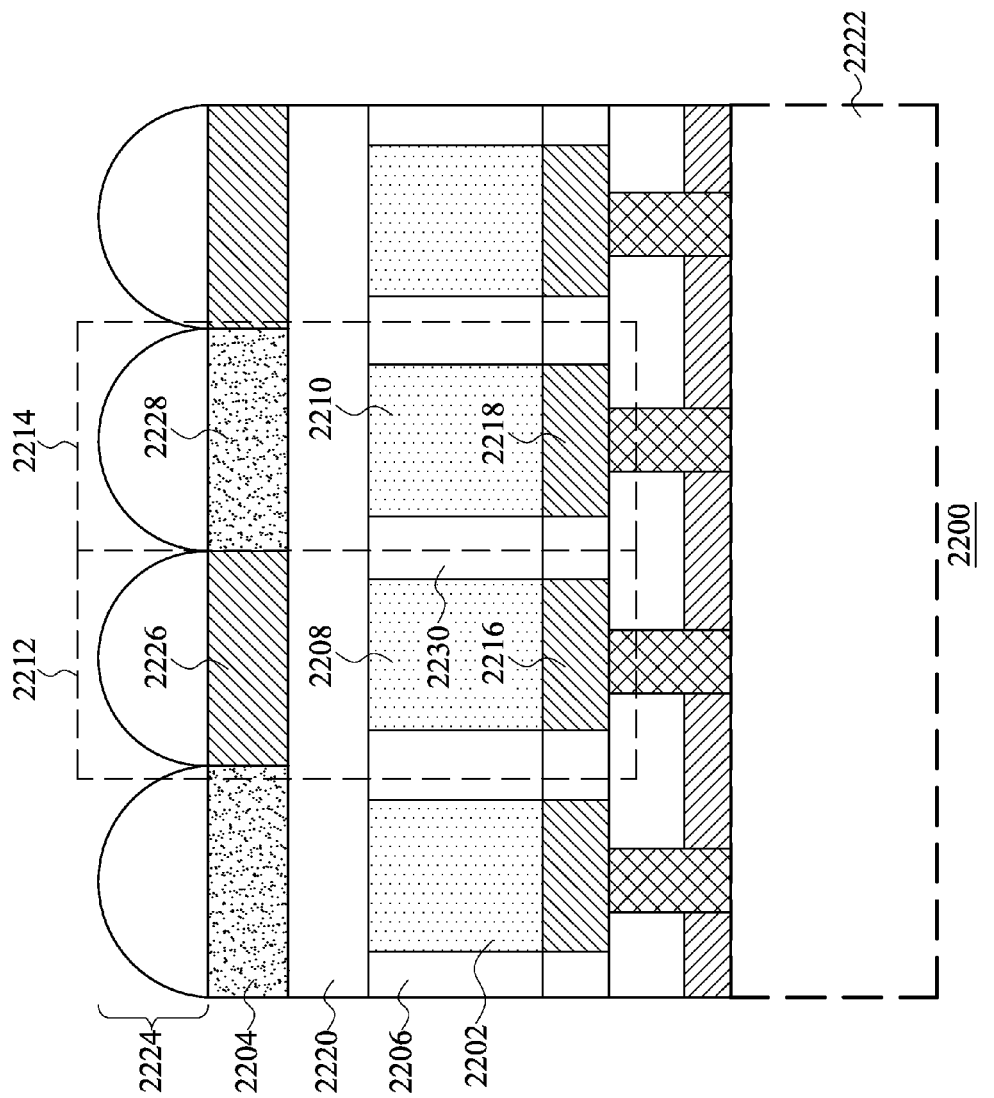
FIG. 22 is an exemplary diagram for a photo diode according to a first embodiment of the invention.

FIG. 22 is an exemplary diagram for a photo diode according to a first embodiment of the invention. As shown in FIG. 22, a photo diode 2200 may include a substrate (not shown), a photo conversion layer 2202, a color filter layer 2204 and a dielectric layer 2206. The photo conversion layer 2202 is disposed over the substrate (not shown). The color filter layer 2204 is disposed over the photo conversion layer 2202. A portion 2230 of the dielectric layer 2206 defines a first portion 2208 of the photo conversion layer 2202 corresponding to a first pixel 2212 from a second portion 2210 of the photo conversion layer 2202 corresponding to a second pixel 2214. The refractive index of the dielectric layer 2206 may be lower than the refractive index of the photo conversion layer 2202.

In an embodiment of the invention, the photo diode 2200 further includes bottom electrodes 2216, 2218 disposed over the substrate (not shown). The bottom electrode 2216 may correspond to the first pixel 2212, and the bottom electrode 2218 may correspond to the second pixel 2214. In an embodiment of the invention, the photo diode 2200 further includes a top electrode 2220. The top electrode 2220 is disposed over the photo conversion layer 2202. In an embodiment of the invention, the top electrode 2220 is an indium tin oxide layer. In an embodiment of the invention, the photo conversion layer 2202 is an organic film layer. In an embodiment of the invention, the photo diode 2200 further includes a read out circuit 2222. The read out circuit 2222 is disposed over the substrate (not shown). In an embodiment of the invention, the photo diode 2200 further includes a micro lens layer 2224. The micro lens layer 2224 is disposed over the color filter layer 2204. In an embodiment of the invention, a first portion 2226 of the color filter layer 2204 corresponding to the first pixel 2212 is a green filter, and a second portion 2228 of the color filter layer 2204 corresponding to the second pixel 2214 is a red filter. In an embodiment of the invention, the dielectric layer 2206 includes a first grid corresponding to the first pixel 2212 and a second grid corresponding to the second pixel 2214.

Figure 23:
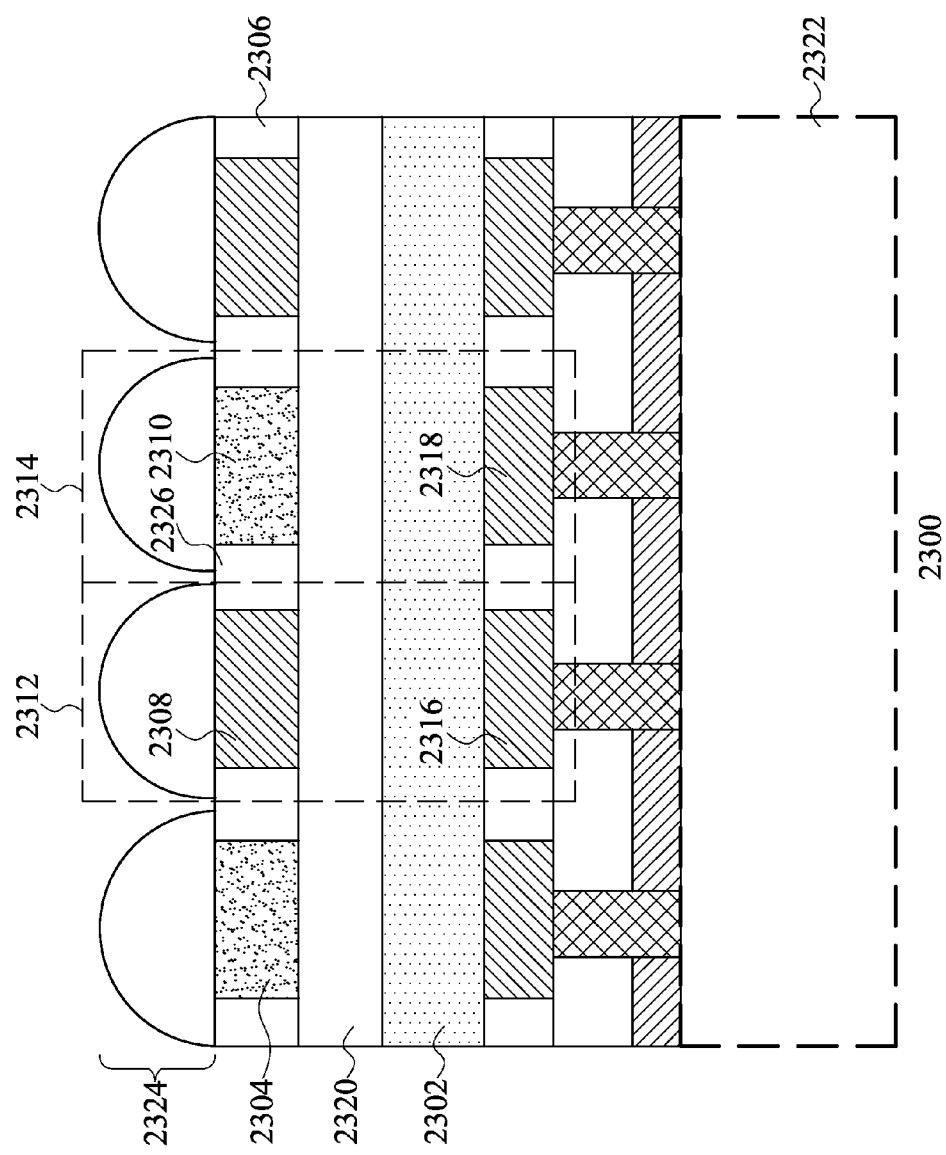
FIG. 23 is an exemplary diagram for a photo diode according to a second embodiment of the invention.

FIG. 23 is an exemplary diagram for a photo diode according to a second embodiment of the invention. As shown in FIG. 23, another photo diode 2300 includes a substrate (not shown), a photo conversion layer 2302, a color filter layer 2304 and a dielectric layer 2306. The photo conversion layer 2302 is disposed over the substrate (not shown). The color filter layer 2304 is disposed over the photo conversion layer 2302. A portion 2326 of the dielectric layer 2306 defines a first portion 2308 of the color filter layer 2304 corresponding to a first pixel 2312 from a second portion 2310 of the color filter layer 2304 corresponding to a second pixel 2314. The refractive index of the dielectric layer 2306 is lower than the refractive index of the color filter layer 2304.

In an embodiment of the invention, the photo diode 2300 further includes a bottom electrode 2316, 2318 disposed over the substrate (not shown). The bottom electrode 2316 may correspond to the first pixel 2312, and the bottom electrode 2318 may correspond to the second pixel 2314. In an embodiment of the invention, the photo diode 2300 further includes a top electrode 2320. The top electrode 2320 is disposed over the photo conversion layer 2302. In an embodiment of the invention, the top electrode 2320 is an indium tin oxide layer. In an embodiment of the invention, the photo conversion layer 2302 is an organic film layer. In an embodiment of the invention, the photo diode 2300 further includes a read out circuit 2322. The read out circuit 2322 is disposed over the substrate (not shown). In an embodiment of the invention, the photo diode 2300 further includes a micro lens layer 2324. The micro lens layer 2324 is disposed over the color filter layer 2304. In an embodiment of the invention, the first portion 2308 of the color filter layer 2304 corresponding to the first pixel 2312 is a green filter, and the second portion 2310 of the color filter layer 2304 corresponding to the second pixel 2314 is a red filter. In an embodiment of the invention, the dielectric layer 2306 includes a first grid corresponding to the first pixel 2312 and a second grid corresponding to the second pixel 2314.

Figure 24:
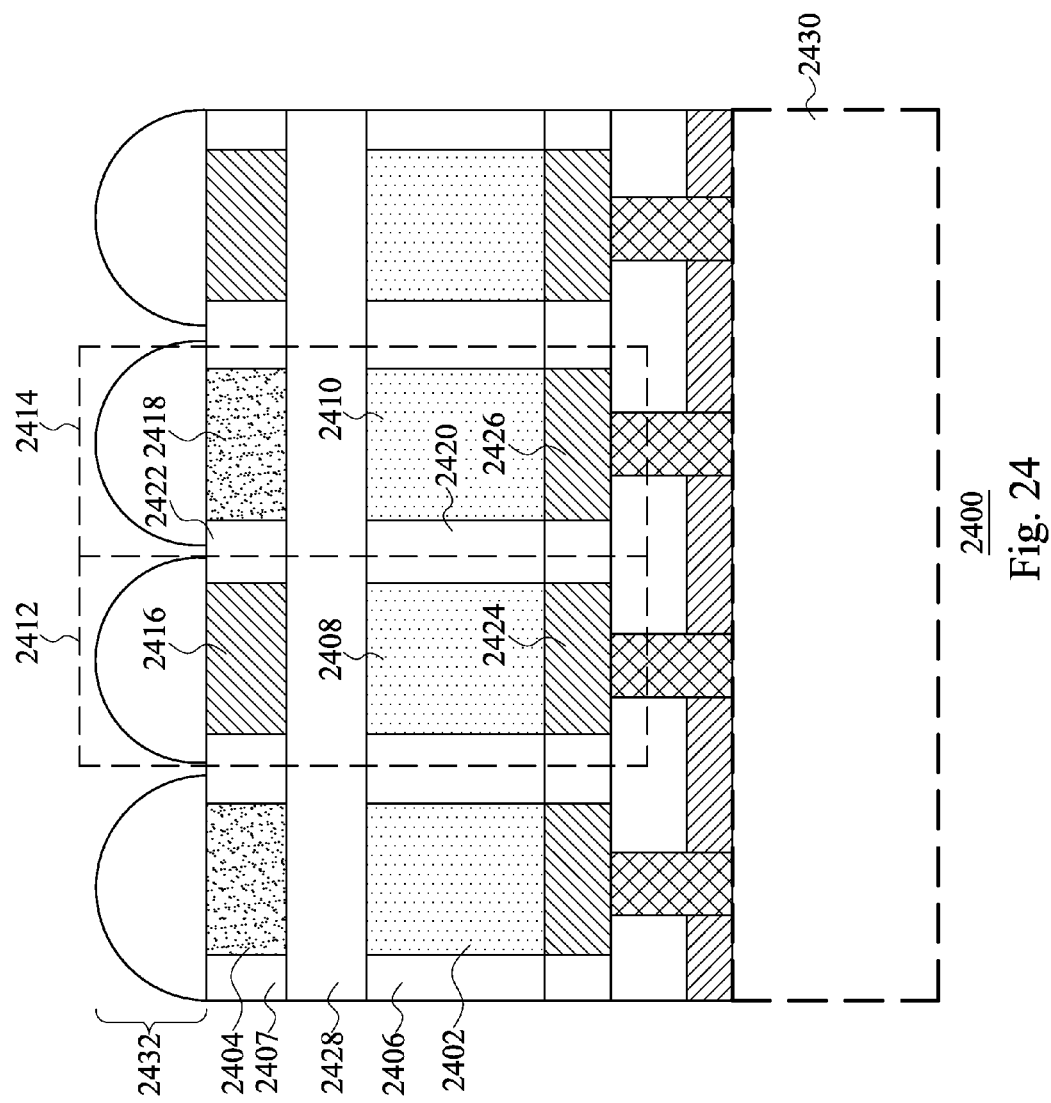
FIG. 24 is an exemplary diagram for a photo diode according to a third embodiment of the invention.

FIG. 24 is an exemplary diagram for a photo diode according to a third embodiment of the invention. As shown in FIG. 24, another photo diode 2400 includes a substrate (not shown), a photo conversion layer 2402, a color filter layer 2404 and dielectric layers 2406, 2407. The photo conversion layer 2402 is disposed over the substrate (not shown). The color filter layer 2404 is disposed over the photo conversion layer 2402. A portion 2420 of the dielectric layer 2406 defines a first portion 2408 of the photo conversion layer 2402 corresponding to a first pixel 2412 from a second portion 2410 of the photo conversion layer 2402 corresponding to a second pixel 2414. The refractive index of the dielectric layer 2406 is lower than the refractive index of the photo conversion layer 2402. A portion 2422 of the dielectric layer 2407 also defines a first portion 2416 of the color filter layer 2404 corresponding to a first pixel 2412 from a second portion 2418 of the color filter layer 2404 corresponding to a second pixel 2414. The refractive index of the dielectric layer 2407 is lower than the refractive index of the color filter layer 2404.

In an embodiment of the invention, the photo diode 2400 further includes a bottom electrode 2424, 2426 disposed over the substrate (not shown). The bottom electrode 2424 may correspond to the first pixel 2412, and the bottom electrode 2318 may correspond to the second pixel 2314. In an embodiment of the invention, the photo diode 2400 further includes a top electrode 2428. The top electrode 2428 is disposed over the photo conversion layer 2402. In an embodiment of the invention, the top electrode 2428 is an indium tin oxide layer. In an embodiment of the invention, the photo conversion layer 2402 is an organic film layer. In an embodiment of the invention, the photo diode 2400 further includes a read out circuit 2430. The read out circuit 2430 is disposed over the substrate (not shown). In an embodiment of the invention, the photo diode 2400 further includes a micro lens layer 2432. The micro lens layer 2432 is disposed over the color filter layer 2404. In an embodiment of the invention, a first portion 2416 of the color filter layer 2404 corresponding to the first pixel 2412 is a green filter, and the second portion 2418 of the color filter layer 2404 corresponding to the second pixel 2414 is a red filter. In an embodiment of the invention, the dielectric layer 2406 includes two grids. Each of the grids the dielectric layer 2406 respectively may correspond to the first pixel 2412 and the second pixel 2414. In an embodiment of the invention, the dielectric layer 2407 includes another two grids. Each of the grids of the dielectric layer 2407 respectively may correspond to the first pixel 2412 and the second pixel 2414.

Figure 25:
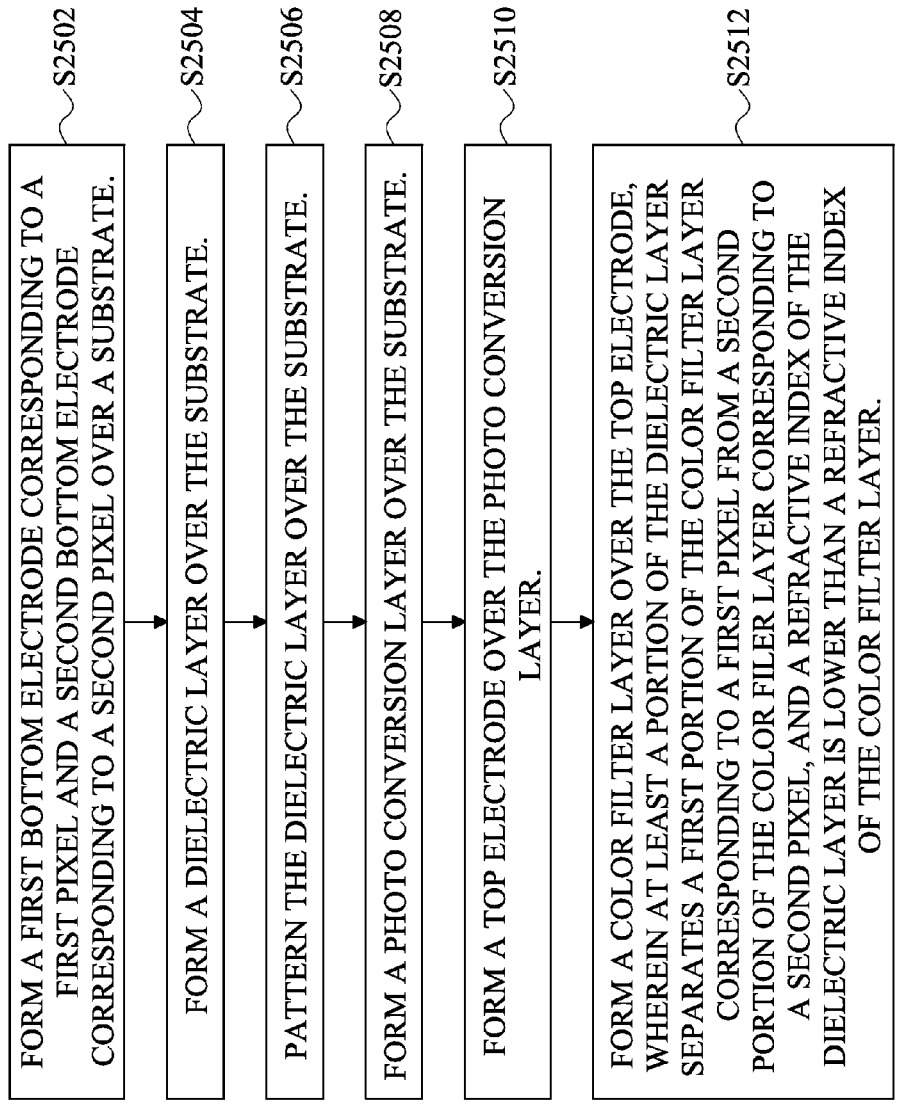
FIG. 25 is a flow chart for forming a photo diode according to a first exemplary embodiment of the invention.

FIG. 25 is a flow chart for forming a photo diode according to a first exemplary embodiment of the invention. As shown in FIG. 25, the method 2500 for forming a photo diode is provided. The method 2500 may include the following procedures: forming a first bottom electrode corresponding to a first pixel and a second bottom electrode corresponding to a second pixel over a substrate (S2502); forming a dielectric layer over the substrate (S2504); patterning the dielectric layer over the substrate (S2506); forming a photo conversion layer over the substrate (S2508); forming a top electrode over the photo conversion layer (S2510); and forming a color filter layer over the top electrode, wherein at least a portion of the dielectric layer separates a first portion of the color filter layer corresponding to a first pixel from a second portion of the color filer layer corresponding to a second pixel, and a refractive index of the dielectric layer is lower than a refractive index of the color filter layer (S2512).

Figure 26:
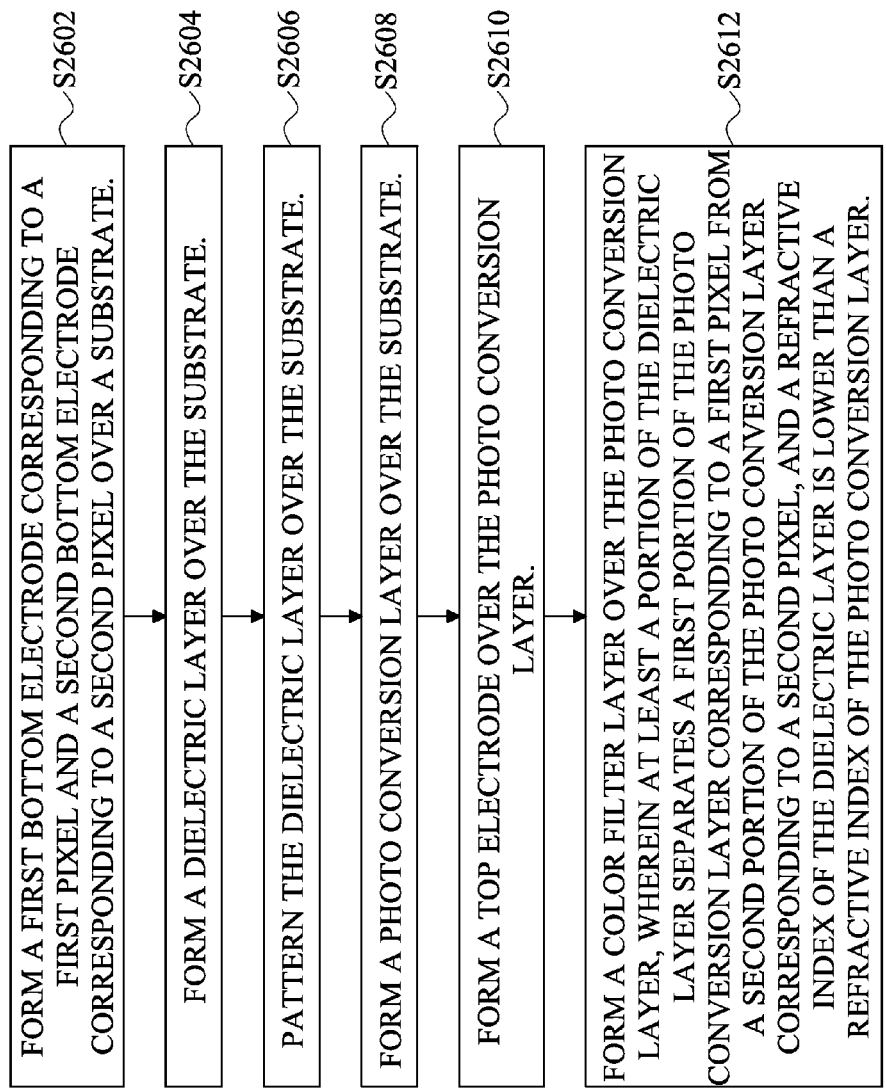
FIG. 26 is a flow chart for forming a photo diode according to a second exemplary embodiment of the invention.

FIG. 26 is a flow chart for forming a photo diode according to a second exemplary embodiment of the invention. As shown in FIG. 26, the method 2600 for forming a photo diode is provided. The method 2600 may include the following procedures: forming a first bottom electrode corresponding to a first pixel and a second bottom electrode corresponding to a second pixel over a substrate (S2602); forming a dielectric layer over the substrate (S2604); patterning the dielectric layer over the substrate (S2606); forming a photo conversion layer over the substrate (S2608); forming a top electrode over the photo conversion layer (S2610); and forming a color filter layer over the photo conversion layer, wherein at least a portion of the dielectric layer separates a first portion of the photo conversion layer corresponding to a first pixel from a second portion of the photo conversion layer corresponding to a second pixel, and a refractive index of the dielectric layer is lower than a refractive index of the photo conversion layer (S2612).

This written description uses examples to disclose the disclosure, include the best mode, and also to enable a person skilled in the art to make and use the disclosure. The patentable scope of the disclosure may include other examples that occur to those skilled in the art.

One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein may be manufactured, used, or shipped in a number of positions and orientations. Persons skilled in the art will recognize various equivalent combinations and substitutions for various components shown in the figures.

What is claimed is:

1. A method for forming a photo diode, comprising:
   forming a first bottom electrode corresponding to a first pixel and a second bottom electrode corresponding to a second pixel over a substrate;
   forming a dielectric layer over the substrate;
   patterning the dielectric layer over the substrate;
   forming a photo conversion layer over the substrate;
   forming a top electrode over the photo conversion layer; and
   forming a color filter layer over the top electrode,
   wherein at least a portion of the dielectric layer separates a first portion of the color filter layer corresponding to a first pixel from a second portion of the color filer layer corresponding to a second pixel, and a refractive index of the dielectric layer is lower than a refractive index of the color filter layer.

2. The method of claim 1, further comprising: forming a micro lens layer over the color filter layer.

3. The method of claim 1, wherein forming the color filter layer over the photo conversion layer further comprises: forming the first portion of the color filter layer corresponding to the first pixel by a red filter process and forming the second portion of the color filter layer corresponding to the second pixel by a green filter process.

4. The method of claim 1, wherein patterning the dielectric layer over the substrate further comprises: patterning the dielectric layer to form a first grid corresponding to the first pixel and a second grid corresponding to the second pixel.

5. The method of claim 1, further comprising:
   forming a second dielectric layer over the substrate; and
   patterning the second dielectric layer over the substrate,
   wherein at least a portion of the second dielectric layer separates a first portion of the photo conversion layer corresponding to the first pixel from a second portion of the photo conversion layer corresponding to the second pixel, and a refractive index of the second dielectric layer is lower than a refractive index of the photo conversion layer.

6. A photo diode, comprising:
   a substrate;
   a first bottom electrode corresponding to a first pixel over the substrate;
   a second bottom electrode corresponding to a second pixel over the substrate;
   a photo conversion layer over the first bottom electrode and the second bottom electrode;
   a top electrode over the photo conversion layer;
   a color filter layer over the top electrode; and
   a dielectric layer for separating a first portion of the color filter layer corresponding to the first pixel from a second portion of the color filter layer corresponding to the second pixel, wherein a refractive index of the dielectric layer is lower than a refractive index of the color filter layer.

7. The photo diode of claim 6, wherein the top electrode comprises indium tin oxide.

8. The photo diode of claim 6, wherein the photo conversion layer comprises an organic film.

9. The photo diode of claim 6, further comprising: a read out circuit disposed over the substrate.

10. The photo diode of claim 6, further comprising: a micro lens layer disposed over the color filter layer.

11. The photo diode of claim 6, wherein the first portion of the color filter layer corresponding to the first pixel is a red filter; and the second portion of the color filter layer corresponding to the second pixel is a green filter.

12. The photo diode of claim 6, wherein the dielectric layer comprises a first grid corresponding to the first pixel and a second grid corresponding to the second pixel.

13. The photo diode of claim 6, further comprising: a second dielectric layer for separating a first portion of the photo conversion layer corresponding to the first pixel from a second portion of the photo conversion layer corresponding to the second pixel, wherein a refractive index of the second dielectric layer is lower than a refractive index of the photo conversion layer.

14. A photo diode, comprising:
   a substrate;
   a first bottom electrode corresponding to a first pixel over the substrate;
   a second bottom electrode corresponding to a second pixel over the substrate;
   a photo conversion layer over the first bottom electrode and the second bottom electrode;
   a top electrode over the photo conversion layer;
   a color filter layer over the top electrode; and
   a dielectric layer for separating a first portion of the photo conversion layer corresponding to the first pixel from a second portion of the photo conversion layer corresponding to the second pixel, wherein a refractive index of the dielectric layer is lower than a refractive index of the photo conversion,
   wherein the photo diode further comprises a second dielectric layer for separating a first portion of the color filter layer corresponding to the first pixel from a second portion of the color filter layer corresponding to the second pixel.

15. The photo diode of claim 14, wherein the top electrode comprises indium tin oxide.

16. The photo diode of claim 14, wherein the photo conversion layer comprises an organic film.

17. The photo diode of claim 14, further comprising: a read out circuit disposed over the substrate.

18. The photo diode of claim 14, further comprising: a micro lens layer disposed over the color filter layer.

19. The photo diode of claim 14, wherein the dielectric layer comprises a first grid corresponding to the first pixel and a second grid corresponding to the second pixel.

20. The photo diode of claim 14, wherein a refractive index of the second dielectric layer is lower than a refractive index of the color filter layer.

* * * * *